(12) United States Patent
Zhang et al.

(10) Patent No.: US 12,451,073 B2
(45) Date of Patent: Oct. 21, 2025

(54) DISPLAY SUBSTRATE AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Jingwen Zhang, Beijing (CN); Yunsheng Xiao, Beijing (CN); Miao Wang, Beijing (CN); Yuqian Pang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/921,573

(22) Filed: Oct. 21, 2024

(65) Prior Publication Data

US 2025/0124871 A1    Apr. 17, 2025

Related U.S. Application Data

(63) Continuation of application No. 18/402,945, filed on Jan. 3, 2024, now Pat. No. 12,159,583, which is a continuation of application No. 17/440,907, filed as application No. PCT/CN2020/132330 on Nov. 27, 2020, now Pat. No. 11,900,874.

(51) Int. Cl.
G09G 3/3233    (2016.01)
H10K 59/00    (2023.01)
H10K 59/131    (2023.01)

(52) U.S. Cl.
CPC ......... *G09G 3/3233* (2013.01); *H10K 59/131* (2023.02); *G09G 2300/0819* (2013.01); *G09G 2300/0842* (2013.01); *G09G 2310/08* (2013.01); *G09G 2320/0247* (2013.01); *G09G 2320/0626* (2013.01); *H10K 59/00* (2023.02)

(58) Field of Classification Search
None
See application file for complete search history.

(56) References Cited

U.S. PATENT DOCUMENTS

2019/0385522 A1* 12/2019 Song .................... G09G 3/3291

* cited by examiner

*Primary Examiner* — Stephen T. Reed
(74) *Attorney, Agent, or Firm* — HOUTTEMAN LAW LLC

(57) ABSTRACT

A display substrate and a display apparatus are provided, and the display substrate includes a pixel circuit with a light emitting module configured to emit light; a driving module configured to drive the light emitting module to emit light based on a driving voltage in a luminescence stage; a storage module configured to maintain and provide the driving voltage to the driving module in the luminescence stage; a first transistor, having a first electrode coupled to a position from which the driving module acquires the driving voltage; a second transistor, having a first electrode coupled to the first electrode of the first transistor, and a second electrode being not directly coupled to a signal source; and a voltage stabilizing capacitor, having a first electrode coupled to the second electrode of the second transistor, and a second electrode coupled to a constant voltage signal source.

19 Claims, 11 Drawing Sheets

DISPLAY SUBSTRATE AND DISPLAY APPARATUS

This is a continuation application of U.S. patent application Ser. No. 18/402,945, filed on Jan. 3, 2024, which is a continuation application of U.S. patent application Ser. No. 17/440,907, filed on Sep. 20, 2021, a National Phase Application filed under 35 U.S.C. 371 as a national stage of PCT/CN2020/132330 filed on Nov. 27, 2020, the content of each of which is hereby incorporated by reference in its entirety.

TECHNICAL FIELD

The embodiments of the present disclosure relate to the technical field of the pixel circuit, and in particular to a display substrate and a display apparatus.

BACKGROUND

In an organic light emitting diode (OLED) display substrate, in a luminescence stage, a certain driving voltage is applied to a gate of a driving transistor, such that the organic light emitting diode emits light of a corresponding brightness for display. However, in the display period, the voltage on the gate of the driving transistor may be changed due to a leakage current, resulting in a brightness change of the light emitted by the organic light emitting diode and a flicker phenomenon, thereby affecting the display quality.

SUMMARY

Embodiments of the present disclosure provide a pixel circuit and a driving method thereof, a display substrate and a display apparatus.

In a first aspect, an embodiment of the present disclosure provides a pixel substrate, including:
  a light emitting module configured to emit light;
  a driving module configured to drive the light emitting module to emit light based on a driving voltage in a luminescence stage;
  a storage module configured to maintain and provide the driving voltage to the driving module in the luminescence stage;
  a first transistor having a first electrode coupled to a position from which the driving module acquires the driving voltage;
  a second transistor having a first electrode coupled to the first electrode of the first transistor, and a second electrode being not directly coupled to a signal source; and
  a voltage stabilizing capacitor having a first electrode coupled to the second electrode of the second transistor, and a second electrode coupled to a constant voltage signal source.

In some embodiments, the pixel circuit further includes:
  a third transistor having a first electrode coupled to a second electrode of the first transistor, and a gate coupled to a gate of the first transistor; and
  a fourth transistor having a first electrode coupled to the second electrode of the second transistor, and a gate coupled to a gate of the second transistor;
  wherein the light emitting module includes a light emitting device;
  the driving module includes a driving transistor configured to drive the light emitting device to emit light based on a voltage at a gate of the driving transistor; and
  the storage module includes a storage capacitor having a first electrode coupled to the gate of the driving transistor and configured to maintain the driving voltage at the first electrode of the storage capacitor and provide it to the driving module in the luminescence stage.

In some embodiments, the pixel circuit includes a first reset module and a writing module;
  the first reset module is configured to reset a voltage at the gate of the driving transistor based on signals from an initialization signal terminal and a first reset signal terminal; and the first reset module includes:
  the first transistor;
  the third transistor having the first electrode coupled to the second electrode of the first transistor, a second electrode coupled to the initialization signal terminal, and the gate coupled to the gate of the first transistor and the first reset signal terminal;
  the writing module is configured to write the driving voltage to the first electrode of the storage capacitor based on signals from a gate signal terminal and a data signal terminal; and the writing module includes:
  the second transistor;
  the fourth transistor having the first electrode coupled to the second electrode of the second transistor, a second electrode coupled to a second electrode of the driving transistor, and the gate coupled to the gate of the second transistor and the gate signal terminal;
  a fifth transistor having a first electrode coupled to a first electrode of the driving transistor, a second electrode coupled to the data signal terminal, and a gate coupled to the gate signal terminal;
  a sixth transistor having a first electrode coupled to a first power supply signal terminal, a second electrode coupled to the first electrode of the driving transistor, and a gate coupled to a control signal terminal;
  wherein the driving transistor and the light emitting device are connected in series between the first power supply signal terminal and a second power supply signal terminal;
  a second electrode of the storage capacitor is coupled to the first power supply signal terminal; and
  a second electrode of the light emitting device is coupled to the second power supply signal terminal.

In some embodiments, the constant voltage signal source is any one of the initialization signal terminal, the first power supply signal terminal and the second power supply signal terminal.

In some embodiments, the pixel circuit further includes:
  a control module configured to control whether the light emitting device emits light based on a signal from the control signal terminal, and including a seventh transistor having a first electrode coupled to the second electrode of the driving transistor, a second electrode coupled to a first electrode of the light emitting device, and a gate coupled to the control signal terminal; and
  a second reset module configured to reset a voltage at the first electrode of the light emitting device based on a signal from a second reset signal terminal and the signal from the initialization signal terminal, and including an eighth transistor having a first electrode coupled to the first electrode of the light emitting device, a second electrode coupled to the initialization signal terminal, and a gate coupled to the second reset signal terminal.

In some embodiments, the driving transistor, the first transistor, the second transistor, the third transistor, the fourth transistor, the fifth transistor, the sixth transistor, the seventh transistor and the eighth transistor each are P-type transistors; or the driving transistor, the first transistor, the second transistor, the third transistor, the fourth transistor, the fifth transistor, the sixth transistor, the seventh transistor and the eighth transistor each are N-type transistors.

In a second aspect, an embodiment of the present disclosure provides a driving method of any one of the pixel circuits, wherein the driving method of the pixel circuit includes:

in a luminescence stage, maintaining the driving voltage and proving the driving voltage to the driving module by the storage module.

In some embodiments, the driving method of the pixel circuit includes:

continuously providing an initialization signal to the initialization signal terminal, continuously providing a first power supply signal to the first power supply signal terminal, and continuously providing a second power supply signal to the second power supply signal terminal;

in a reset stage, providing a turn-on signal to the first reset signal terminal, providing a turn-off signal to the gate signal terminal, and providing a turn-off signal to the control signal terminal;

in a writing stage, providing a turn-off signal to the first reset signal terminal, providing a turn-on signal to the gate signal terminal, providing a turn-off signal to the control signal terminal, and providing a data signal to the data signal terminal; and in a luminescence stage, providing a turn-off signal to the first reset signal terminal, providing a turn-off signal to the gate signal terminal, and providing a turn-on signal to the control signal terminal.

In some embodiments, the driving method of the pixel circuit further includes:

in the reset stage, providing a turn-off signal to the second reset signal terminal;

in the writing stage, providing a turn-on signal to the second reset signal terminal; and in the luminescence stage, providing a turn-off signal to the second reset signal terminal.

In a third aspect, an embodiment of the present disclosure provides a display substrate, including:

a base substrate; and a plurality of sub-pixels on the base substrate, at least some of the sub-pixels including any one of the above pixel circuits.

In some embodiments, the first electrode of the voltage stabilizing capacitor includes a connection portion coupled between the second electrode of the second transistor and the first electrode of the fourth transistor and including a plurality of bending structures.

In some embodiments, the first electrode of the voltage stabilizing capacitor and the second electrode of the second transistor are arranged in a same layer and coupled to each other as a single piece.

In some embodiments, the first electrode of the voltage stabilizing capacitor and an active region of the driving transistor are arranged in a same layer, and the first electrode of the voltage stabilizing capacitor is made of a conductive semiconductor material; and the second electrode of the second transistor and the active region of the driving transistor are arranged in a same layer, and the second electrode of the second transistor is made of a conductive semiconductor material.

In some embodiments, the second electrode of the voltage stabilizing capacitor and the initialization signal terminal are arranged in a same layer.

In some embodiments, in a direction gradually far away from the base substrate, the display substrate successively includes:

the active region of the driving transistor and the first electrode of the voltage stabilizing capacitor;

a gate insulating layer;

the gate of the driving transistor;

a first interlayer insulating layer; and the second electrode of the voltage stabilizing capacitor and the initialization signal terminal.

In some embodiments, the second electrode of the voltage stabilizing capacitor is coupled to the second electrode of the storage capacitor.

In some embodiments, the initialization signal terminal includes a first initialization signal terminal and a second initialization signal terminal arranged in a same layer, and the first initialization signal terminal and the second initialization signal terminal are parallel to each other and separated from each other;

the second electrode of the eighth transistor is coupled to the first initialization signal terminal; and the second electrode of the third transistor is coupled to the second initialization signal terminal.

In some embodiments, the first reset signal terminal extends in a first direction; and first reset signal terminals of at least some of pixel circuits are multiplexed as second reset signal terminals of adjacent pixel circuits in a second direction, and the first direction crosses over the second direction.

In some embodiments, the second electrode of the storage capacitor includes a transverse connection structure extending in a first direction; at least some of transverse connection structures of adjacent pixel circuits in the first direction are coupled to each other; and the first power supply signal terminal extends in a second direction, and the first direction crosses over the second direction.

In some embodiments, the display substrate further includes:

an auxiliary conductive structure overlapping with the first power supply signal terminal; at least one insulating layer is provided between the auxiliary conductive structure and the first power supply signal terminal, and the auxiliary conductive structure is coupled to the first power supply signal terminal through a via hole extending through the insulating layer.

In some embodiments, in a direction gradually far away from the base substrate, the display substrate successively includes:

a semiconductor layer including: the first electrode, the second electrode and the active region of the driving transistor; the first electrode, the second electrode and the active region of the first transistor; the first electrode, the second electrode and the active region of the second transistor; the first electrode, the second electrode and the active region of the third transistor; the first electrode, the second electrode and the active region of the fourth transistor; the first electrode, the second electrode and the active region of the fifth transistor; the first electrode, the second electrode and the active region of the sixth transistor; the first electrode, the second electrode and the active region of the seventh transistor; the first electrode, the second electrode and the active region of the eighth transistor; and the first electrode of the voltage stabilizing capacitor; wherein the first electrode of the voltage stabilizing capacitor and the second electrode of the second transistor is coupled to each other as a single piece, and are made of a conductive semiconductor material;

a gate insulating layer;

a first gate layer including: the gate of the driving transistor, the gate of the first transistor, the gate of the second transistor, the gate of the third transistor, the gate of the fourth transistor, the gate of the fifth transistor, the gate of the sixth transistor, the gate of the seventh transistor, the gate of the eighth transistor, the first reset signal terminal, the second reset signal terminal, the control signal terminal and the first electrode of the storage capacitor;

a first interlayer insulating layer;

a second gate layer including the initialization signal terminal, the second electrode of the voltage stabilizing capacitor and the second electrode of the storage capacitor;

a second interlayer insulating layer;

a first source-drain layer including: the first power supply signal terminal, the data signal terminal, a first light emitting access structure and a voltage stabilizing connection structure; wherein the first power supply signal terminal is coupled to the second electrode of the storage capacitor through a via hole extending through the second interlayer insulation layer, and is coupled to the first electrode of the sixth transistor through a via hole extending through the gate insulating layer, the first interlayer insulating layer and the second interlayer insulating layer; the data signal terminal is coupled to the second electrode of the fifth transistor through a via hole extending through the gate insulating layer, the first interlayer insulating layer and the second interlayer insulating layer; the first light emitting access structure is coupled to the second electrode of the seventh transistor through a via hole extending through the gate insulating layer, the first interlayer insulating layer and the second interlayer insulating layer; and the voltage stabilizing connection structure is coupled to the second electrode of the storage capacitor through a via hole extending through the second interlayer insulating layer, and is coupled to the second electrode of the voltage stabilizing capacitor through a via hole extending through the second interlayer insulating layer;

a first planarization layer;

a second source-drain layer including an auxiliary conductive structure and a second light emitting access structure; wherein the auxiliary conductive structure overlaps with the first power supply signal terminal and is coupled to the first power supply signal terminal through a via hole extending through the first planarization layer; and the second light emitting access structure is coupled to the first light emitting access structure through a via hole extending through the first planarization layer;

a second planarization layer; and the first electrode of the light emitting device, wherein the first electrode of the light emitting device is coupled to the second light emitting access structure through a via hole extending through the second planarization layer.

In some embodiments, the first source-drain layer further includes:

a first connection structure, wherein the first connection structure is coupled to the second electrode of the eighth transistor through a via hole extending through the gate insulating layer, the first interlayer insulating layer and the second interlayer insulating layer, and is coupled to the initialization signal terminal through a via hole extending through the second interlayer insulating layer;

a second connection structure, wherein the second connection structure is coupled to the second electrode of the third transistor through a via hole extending through the gate insulating layer, the first interlayer insulating layer and the second interlayer insulating layer, and is coupled to the initialization signal terminal through a via hole extending through the second interlayer insulating layer; and a third connection structure, wherein the third connection structure is coupled to the gate of the driving transistor through a via hole extending through the first interlayer insulating layer and the second interlayer insulating layer, and is coupled to the first electrode of the first transistor through a via hole extending through a via hole extending through the gate insulating layer, the first interlayer insulating layer and the second interlayer insulating layer.

In a fourth aspect, an embodiment of the present disclosure provides a display device, including any one of the above display substrates.

BRIEF DESCRIPTION OF THE DRAWINGS

Drawings are intended to provide a further understanding of the embodiments of the present disclosure and constitute a part of this specification. The drawings together with the embodiments of the present disclosure are used for explaining the present disclosure, but not intended to limit the present disclosure. The above and other features and advantages will become more apparent to those skilled in the art by describing in detail exemplary embodiments thereof with reference to the drawings, in which.

Figure 1:
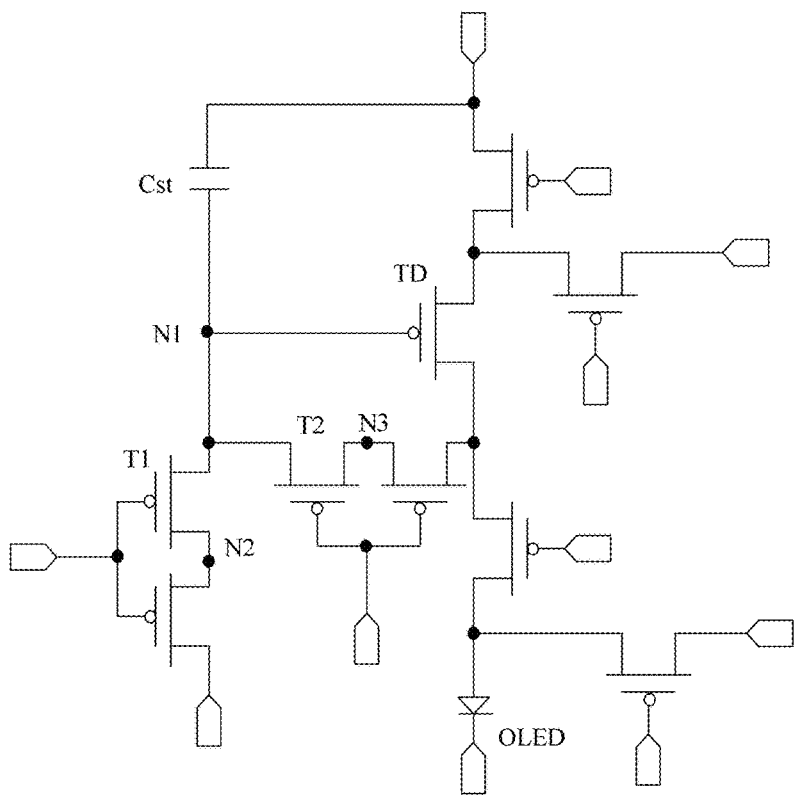
FIG. 1 is a circuit diagram of a pixel circuit in the related art.

The reference numerals in the embodiments of the present disclosure have meanings as follows:

TD: driving transistor; T1: first transistor; T2: second transistor; T3: third transistor; T4: fourth transistor; T5: fifth transistor; T6: sixth transistor; T7: seventh transistor; T8: eighth transistor; OLED: organic light emitting diode;

Cst: storage capacitor; C1: voltage stabilizing capacitor; N1: first node; N2: second node; N3: third node;

GATE: gate signal terminal; DATA: data signal terminal; RESET1: first reset signal terminal; RESET2: second reset signal terminal; INIT: initialization signal terminal; INIT1: first initialization signal terminal; INIT2: second initialization signal terminal; EM: control signal terminal; VDD: first power supply signal terminal; VSS: second power supply signal terminal; VDC: constant voltage signal source;

11: connection portion; 2: light emitting device; 31: auxiliary conductive structure; 32: transverse connection structure; 331: first light emitting access structure; 332: second light emitting access structure; 34: voltage stabilizing connection structure; 351: first connection structure; 352: second connection structure; 353: third connection structure.

DETAILED DESCRIPTION

In order to make those skilled in the art better understand the technical solutions of the embodiments of the present disclosure, a pixel circuit and driving method thereof, a display substrate and a display apparatus in the embodiments of the present disclosure will be described in detail below with reference to the accompanying drawings.

The embodiments of the present disclosure will be described more fully hereinafter with reference to the accompanying drawings, but the embodiments shown may be embodied in different forms and should not be construed as limited to the embodiments set forth herein. On the contrary, the purpose of providing these embodiments is to make the present disclosure thorough and complete, and to enable those skilled in the art to fully understand the scope of the present disclosure.

The embodiments of the present disclosure may be described with reference to plan and/or cross-sectional views by way of idealized schematic illustrations of the present disclosure. Accordingly, the example drawings may be modified in accordance with manufacturing techniques and/or tolerances.

The embodiments of the present disclosure and features of the embodiments may be combined with each other without conflict.

The terminologies used in the present disclosure is for the purpose of describing particular embodiments only and is not intended to limit the present disclosure. As used in the present disclosure, the term "and/or" includes any and all combinations of one or more of the associated listed items. As used in the present disclosure, the singular forms "a (an)" and "the" are intended to include the plural forms as well, unless the context clearly indicates otherwise. As used in the present disclosure, the terms "comprising (including)", "consisting of", specify the presence of features, integers, steps, operations, elements, and/or components, but do not preclude the presence or addition of one or more other features, integers, steps, operations, elements, components, and/or groups thereof.

Unless otherwise defined, all terms (including technical and scientific terms) used in the present disclosure have the same meaning as commonly understood by those skilled in the art. It will be further understood that the terms, such as those defined in commonly used dictionaries, should be interpreted as having meanings that are consistent with their meanings in the context of the related art and the present disclosure, and will not be interpreted in an idealized or overly formal sense unless expressly so defined herein.

The ordinal numerals of "first", "second" and "third" in this specification are provided to avoid the confusion of the constituent elements, rather than to limit the quantity.

In this specification, for the sake of convenience, words and sentences such as "middle", "up", "down", "front", "back", "vertical", "horizontal", "top", "bottom", "inside" and "outside" indicating orientation or positional relationship are used to describe the positional relationship of constituent elements with reference to the drawings, only for the convenience of describing this specification and simplifying the description, rather than indicating or implying that the device or element referred to must have a specific orientation, be constructed and operate in a specific orientation, and it cannot be understood to limit the present disclosure. The position relationship of the constituent elements changes according to the direction of describing the constituent elements. Therefore, it is not limited to the words and sentences described in the specification, and can be replaced appropriately according to the situation.

The embodiments of the present disclosure are not limited to the embodiments shown in the drawings, but include modifications of configurations formed based on manufacturing processes. Thus, the regions illustrated in the drawings have schematic properties, and the shapes of the regions shown in the drawings illustrate specific shapes of regions of elements, but are not intended to be restrictive.

Technical Terms

In the present disclosure, unless otherwise specified, the following technical terms shall be interpreted as follows.

"Transistor" may be specifically a "thin film transistor (TFT)" which refers to a device including at least three terminals, i.e., a gate, a drain, and a source, and an active region coupled to and between the source and the drain. By controlling the voltage relationship among the gate, the source, and the drain, the drain and the source may be insulated from each other and a current may not flow therebetween (i.e., the transistor is turned off), or a current may flow from the source to the drain through the active region (i.e., the transistor is turned on).

"Drain and source of a transistor" are distinguished by the flow direction of the current, so that there is no definite source and drain for the transistor itself when there is no signal. Thus, in the embodiments of the present disclosure, first and second electrodes represent two electrodes, i.e., the source and the drain of the transistor, but there is no necessary correspondence between the first and second electrodes and the source and the drain.

"Signal terminal" refers to the structure in a pixel circuit coupled to other external signal sources to provide corresponding signals. Therefore, the signal terminal is not necessarily a "terminal" or "connection terminal", but can include all the structures coupled to the corresponding signal source. For example, the signal terminal can be formed with the corresponding signal line a piece, or the part of the signal line in the pixel circuit is regarded as the signal terminal. Meanwhile, the signal terminal and the structure coupled to it can also be formed as a piece. For example, if the signal terminal (such as a gate signal terminal) provides a gate signal for the transistor, the part of the signal terminal overlapping with the active region of the transistor can also be the gate of the transistor.

"Signal source" refers to any "source" that can provide required signals, which can be the above "signal terminal".

"Two structures coupled to each other" means that, two structures are in direct contact with and are connected to each other, or are indirectly connected to each other through any other conductive structure. However, in the embodiments of the present disclosure, the indirect connection between two structures by a non-necessary conductive device, such as a transistor, is not regarded as interconnection.

"Node" refers to all the structures in the pixel circuit that can be regarded as one single piece in electricity. For example, the interconnected electrodes and the connection structure between the electrodes may be regarded as a "node", but if the first and second electrodes of a transistor are not interconnected, they are different nodes.

"Turn-on signal" refers to the signal that can turn on the transistor when it is applied to the gate of the transistor. For example, for P-type transistors, the turn-on signal is a low level signal; while for N-type transistors, the turn-on signal is a high level signal.

"Turn-off signal" refers to the signal that can turn off the transistor when it is applied to the gate of the transistor. For example, for P-type transistors, the turn-off signal is a high level signal; while for N-type transistors, the turn-off signal is a low level signal.

"In a same layer" of structures means that the structures are made of a same layer of material and thus are in a same layer in laminated relationship, but does not mean that they are equidistant from a base substrate nor that other layers between them and the base substrate are completely the same.

"Patterning process" refers to steps of forming a structure having a specific pattern, which may be a photolithography process including one or more steps of forming a material layer, coating a photoresist, exposing, developing, etching, stripping the photoresist, and the like. Of course, the patterning process may be other processes, such as an imprinting process and an inkjet printing process.

Related Technology

In some related arts, each of sub-pixels of an organic light emitting diode (OLED) display substrate includes a pixel circuit. The pixel circuit includes an organic light emitting diode for light emitting, that is, organic light emitting diode emits light required by each of the sub-pixels.

Referring to FIG. 1, a structure of an available pixel circuit is shown. A current flowing a driving transistor TD is controlled by its own gate voltage. The current is a driving current Ioled for light emitting of an organic light emitting diode OLED, so that the organic light emitting diode OLED is driven to emit light via the driving transistor TD controlled by a driving voltage. In a luminescence stage, a storage capacitor Cst is used to maintain a gate of the driving transistor TD at a required driving voltage.

Referring to FIG. 1, the gate of the driving transistor TD is further coupled to a second node N2 and a third node N3 through a first transistor T1 and a second transistor T2, respectively. In a luminescence stage, the second node N2 generally has a different voltage from the third node N3. For example, the voltage at the second node N2 may be lower than that at a first node N1, while the voltage at the third node N3 may be higher than that of the first node N1. Since a certain leakage current inevitably occurs in the first transistor T1 and in the second transistor T2, the voltage at the first node N1 will be "pulled down" gradually by the voltage at the second node N2 due to the leakage current in the first transistor T1, while the voltage at the first node N1 will be "pulled up" gradually by the voltage at the third node N3 due to the leakage current in the second transistor T2. Moreover, generally, the "pull up" due to the voltage at the third node N3 is stronger than the "pull down" due to the voltage at the second node N2.

Figure 2:
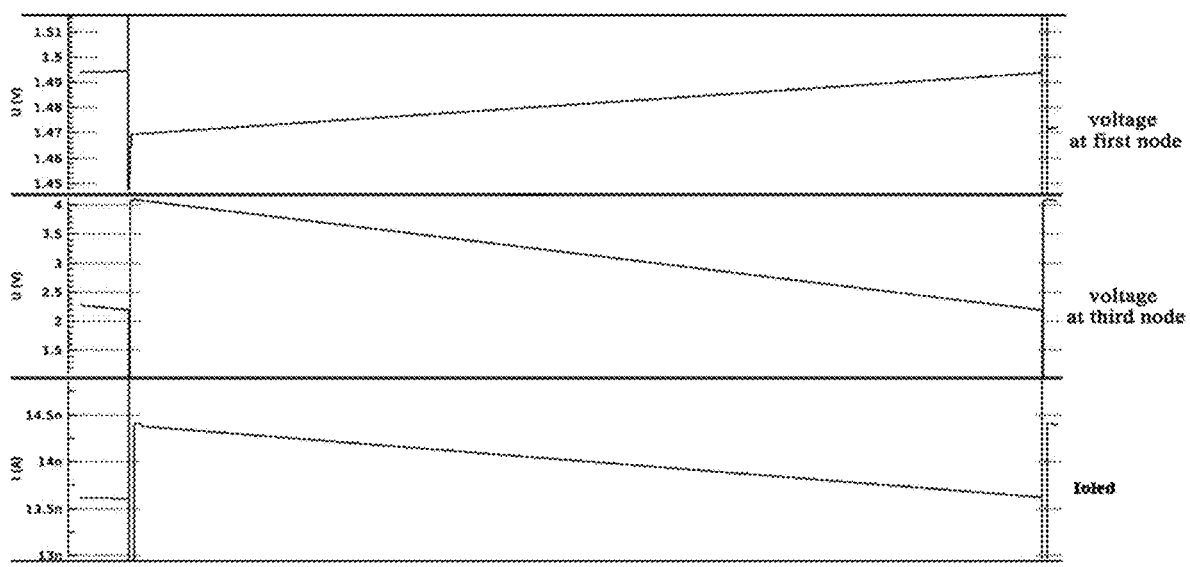
FIG. 2 is a simulation result diagram illustrating change of some signals with time in a pixel circuit in the related art.
Figure 3:
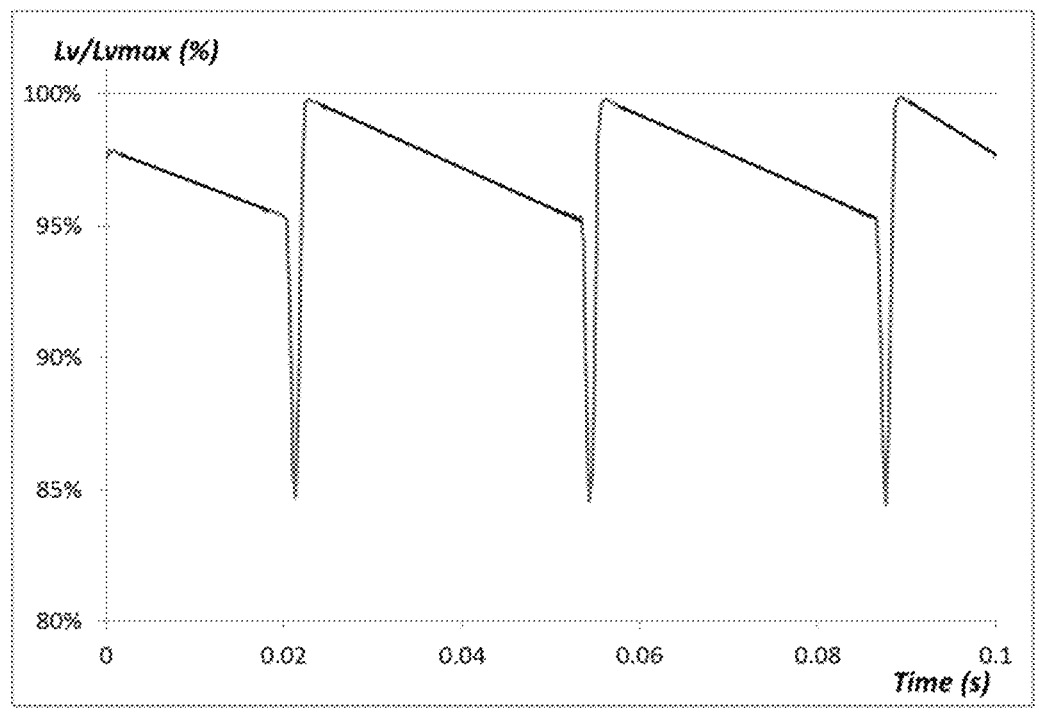
FIG. 3 is a simulation result diagram illustrating change of brightness with time in a pixel circuit in the related art.

Therefore, in the pixel circuit in the related art, FIG. 2 shows a simulation result diagram of some signals with time in a pixel circuit in the related art. Referring to FIG. 2, in the luminescence stage, the voltage at the first node N1 will gradually increase, that is, the driving voltage will increase, so that the driving current Ioled flowing through the organic light emitting diode OLED will decrease. Further, referring to FIG. 3, brightness change of light emitted by the pixel circuit in a plurality of frames is shown, and it can be seen that the brightness of the organic light emitting diode OLED gradually decreases in each of the frames (i.e., in each of luminescence stages).

Therefore, when the above brightness decreases to a level that can be perceptible to human eyes, flicker phenomenon will occur and the display quality will be affected.

Specific Implementation of the Embodiments of the Present Disclosure

In a first aspect, referring to FIGS. 4 to 8, an embodiment of the present disclosure provides a pixel circuit. The pixel circuit includes: a light emitting module configured to emit light; a driving module configured to drive the light emitting module to emit light based on a driving voltage in a luminescence stage; a storage module configured to maintain and provide the driving voltage to the driving module in the luminescence stage; a first transistor T1, a first electrode of which is coupled to a position via which the driving module acquire the driving voltage; a second transistor T2, a first electrode of which is coupled to the first electrode of the first transistor T1, and a second electrode of which is not directly coupled to a signal source; and a voltage stabilizing capacitor C1, a first electrode of which is coupled to the second electrode of the second transistor T2, and a second electrode of which is coupled to a constant voltage signal source VDC.

In the pixel circuit of the embodiments of the present disclosure, the light emitting module is driven to emit light via the driving module based on the driving voltage (e.g., a voltage of a gate of a driving transistor TD) in the luminescence stage, and the storage module is used to maintain and provide the driving voltage in the luminescence stage.

Both the first electrodes of the first and second transistors T1 and T2 are coupled to a position (e.g., a first node N1, that is, the gate of the driving transistor TD), at which the driving voltage is provided to the driving module, and while the second electrodes of the first and second transistors T1 and T2 are coupled to different positions (e.g., coupled to a second node N2 and a third node N3, respectively). Therefore, the voltage at the first node N1 will be changed by the voltage at the second node N2 due to a leakage current in the first transistor T1, while the voltage at the first node N1 will be changed by the voltage at the third node N3 due to a leakage current in the second transistor T2.

Obviously, a second electrode of the first transistor T1 and the second electrode of the second transistor T2 should be coupled to different structures respectively, that is, the first transistor T1 and the second transistor T2 should not be coupled to each other in parallel.

In the luminescence stage, the voltage of the second electrode (i.e., the second node N2) of the first transistor T1 is lower than the voltage (i.e., the driving voltage) of the first electrode (i.e., the first node N1) of the first transistor T1, while the voltage of the second electrode (i.e., the third node) of the second transistor T2 is higher than the voltage of the first electrode (i.e., the first node N1) of the first transistor T1. Therefore, the voltages at the second node N2 and the third node N3 "pull down" and "pull up" the voltage at the first node N1 respectively.

As described above, in some related arts, the "pull up" due to the voltage at the third node N3 is stronger than the "pull down" due to the voltage at the second node N2. Therefore, referring to FIGS. 2 and 3, in the luminescence stage, the voltage (i.e., the driving voltage) at the first node N1 will gradually increase, resulting in the change of display brightness.

In the embodiments of the present disclosure, the second electrode (i.e., the third node N3) of the second transistor T2 is not directly coupled to the signal source, so that the voltage of the second electrode of the second transistor T2 is variable in the luminescence stage. In the embodiments of the present disclosure, the voltage stabilizing capacitor C1 is coupled to the second electrode of the second transistor T2 (i.e., the third node N3), and the other electrode (i.e., a second electrode) of the voltage stabilizing capacitor C1 is coupled to the constant voltage signal source VDC (i.e., coupled to any signal source that provides a constant voltage in a frame). Obviously, since the second electrode of the voltage stabilizing capacitor C1 is provided with a constant voltage signal, the voltage change of the first electrode (i.e., the third node N3) of the capacitor may be prevented, and the larger the capacitance of the voltage stabilizing capacitor C1 is, the stronger the prevention of the voltage change is.

Of course, in practice, parasitic capacitors may also be created in the structures at the third node N3. However, the parasitic capacitances of the parasitic capacitors are very small (usually not more than 1.5 fF), and electrodes of the parasitic capacitors are not coupled to the constant voltage signal source VDC, so that the parasitic capacitors are different from the above voltage stabilizing capacitor C1.

It can be seen that in the embodiments of the present disclosure, the signal stability at the third node N3 can be enhanced by adding a "capacitor (i.e., the voltage stabilizing capacitor C1)" coupled to the second electrode of the second transistor T2 (i.e., the third node N3), so that a "low" voltage at the third node N3 in the luminescence stage can be maintained, thereby reducing its "pull-up" to the voltage at the first node N1. In this case, the "pull down" and "pull up" to the voltage at the first node N1 tend to be balanced, so that the voltage (i.e., the driving voltage) at the first node N1 can be more stable in the luminescence stage, the brightness change of the light emitted by the light emitting device 2 can be reduced, thereby improving or avoiding the flicker phenomenon and enhancing display quality.

Figure 6:
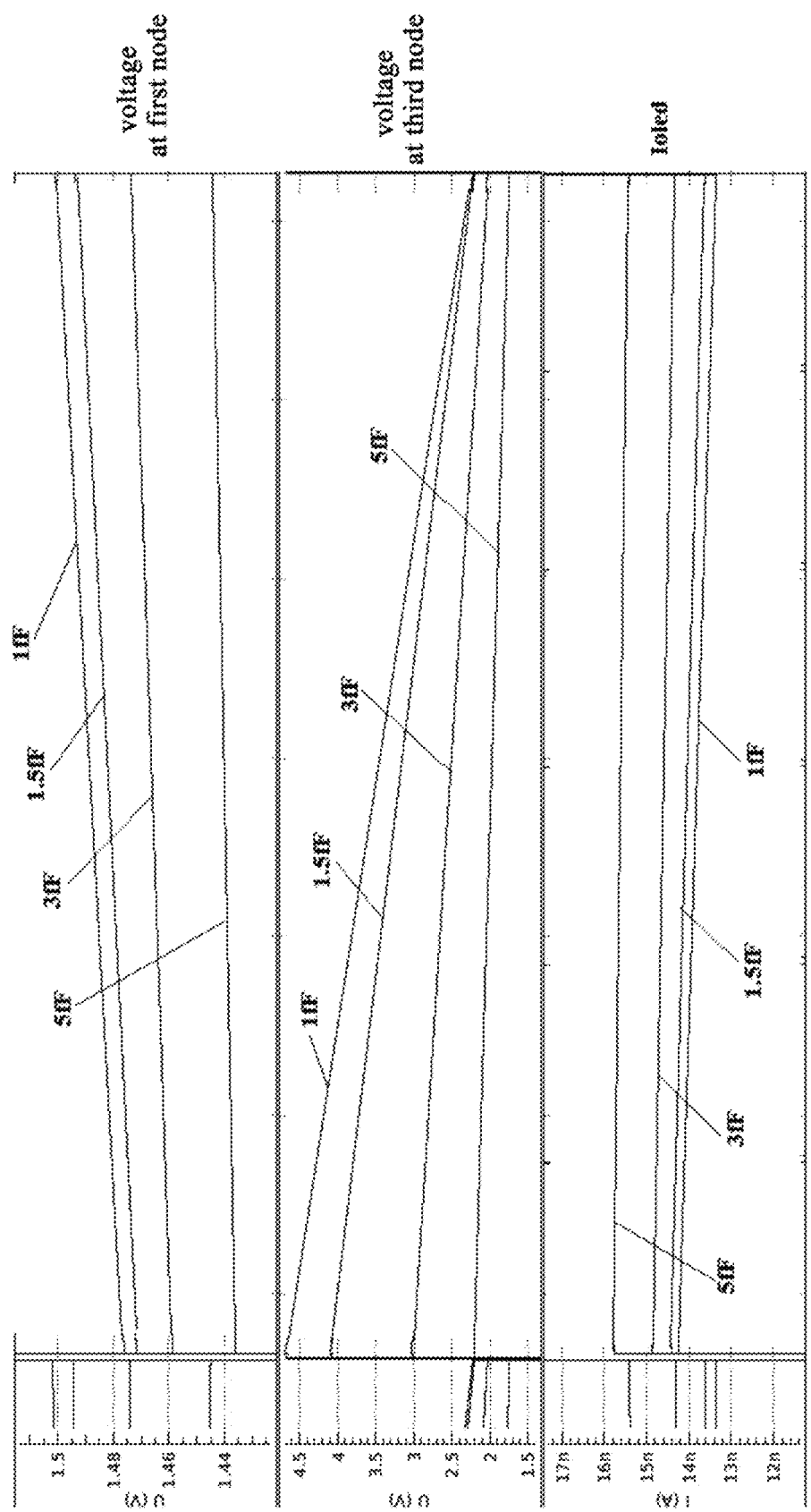
FIG. 6 is a simulation result diagram illustrating change of some signals with time when a voltage stabilizing capacitor has different capacitances in a pixel circuit according to an embodiment of the present disclosure.

Therefore, in the pixel circuit of the embodiments of the present disclosure, when the voltage stabilizing capacitor C1 has a capacitance of 1 fF (femto farad), 1.5 fF, 3 fF and 5 fF respectively, the simulation results of some signals with time in the luminescence stage is shown in FIG. 6.

The voltage at the third node N3 may be higher by "voltage jump" due to the coupling effect with other signals (e.g., signals from a gate signal terminal), resulting in higher initialization voltage in the luminescence stage. Referring to FIG. 6, if the capacitance of the voltage stabilizing capacitor C1 is larger, the initialization voltage at the third node N3 in the luminescence stage is lower, which shows that by increasing the capacitance of the voltage stabilizing capacitor C1, the ability to resist the above "voltage jump" at the third node N3 can be enhanced. In this case, the initialization voltage at the third node N3 in the luminescence stage can decrease, that is, the voltage at the third node N3 can be relatively maintained at a "lower" level in the luminescence stage, the ability of "pulling up" the voltage (i.e., the driving voltage) at the first node N1 is reduced, the voltage change at the first node N1 is reduced, and the driving current Ioled is stabilized. That is, the brightness of the light emitting device 2 can be stabilized in the luminescence stage, thereby improving or avoiding the flickering phenomenon and enhancing the display quality.

Figure 9:
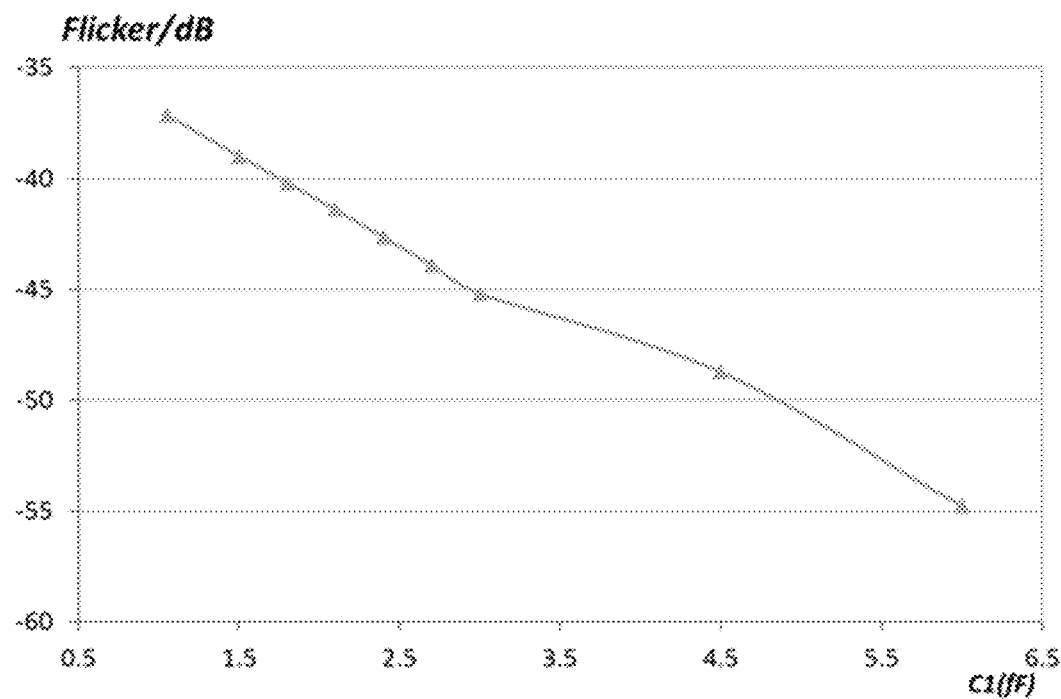
FIG. 9 is a simulation result diagram illustrating change of Flicker values with capacitances of a voltage stabilizing capacitor in a pixel circuit according to an embodiment of the present disclosure.

Furthermore, when the voltage stabilizing capacitor C1 has different capacitances, simulated Flicker values are shown in FIG. 9. The Flicker value is a dimensionless value calculated based on a brightness-time curve in the luminescence stage. The Flicker value is used to indicate a flicker degree of display. The lower the Flicker value is, the smaller the flicker degree is, that is, the more stable the brightness is, and the better the display quality is.

It can be seen that with the increase of the capacitance of the voltage stabilizing capacitor C1, the Flicker value can be greatly reduced, that is, the flicker degree can be reduced.

Figure 4:
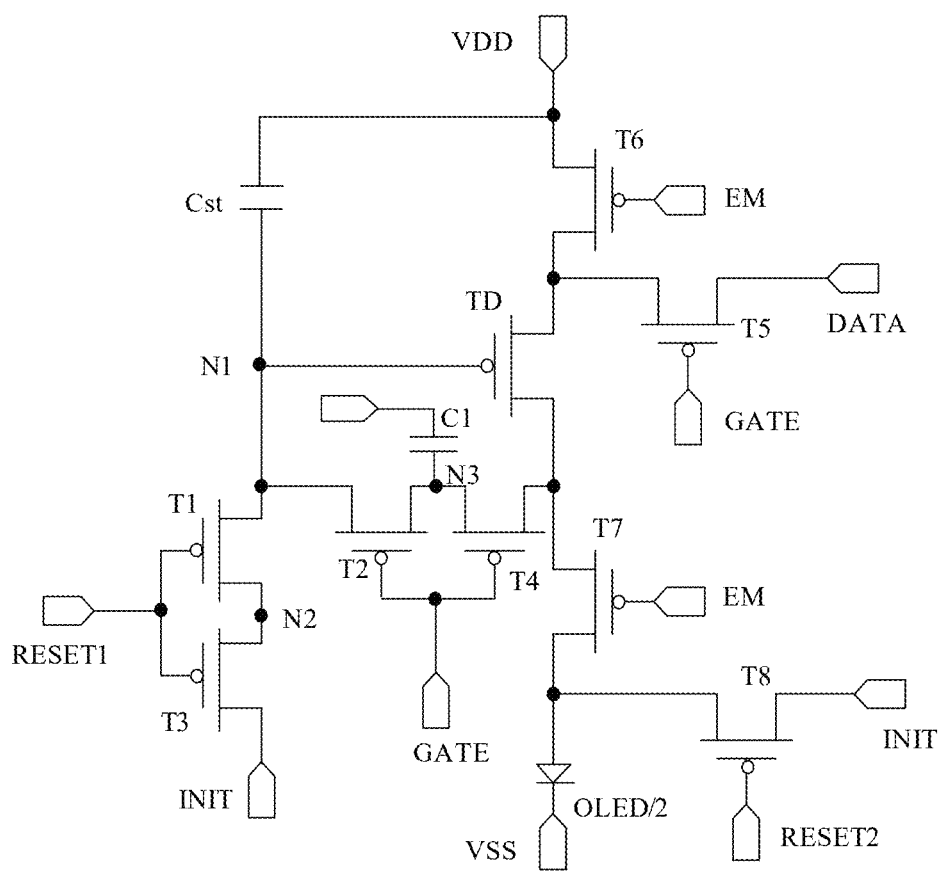
FIG. 4 is a circuit diagram of a pixel circuit according to an embodiment of the present disclosure.
Figure 7:
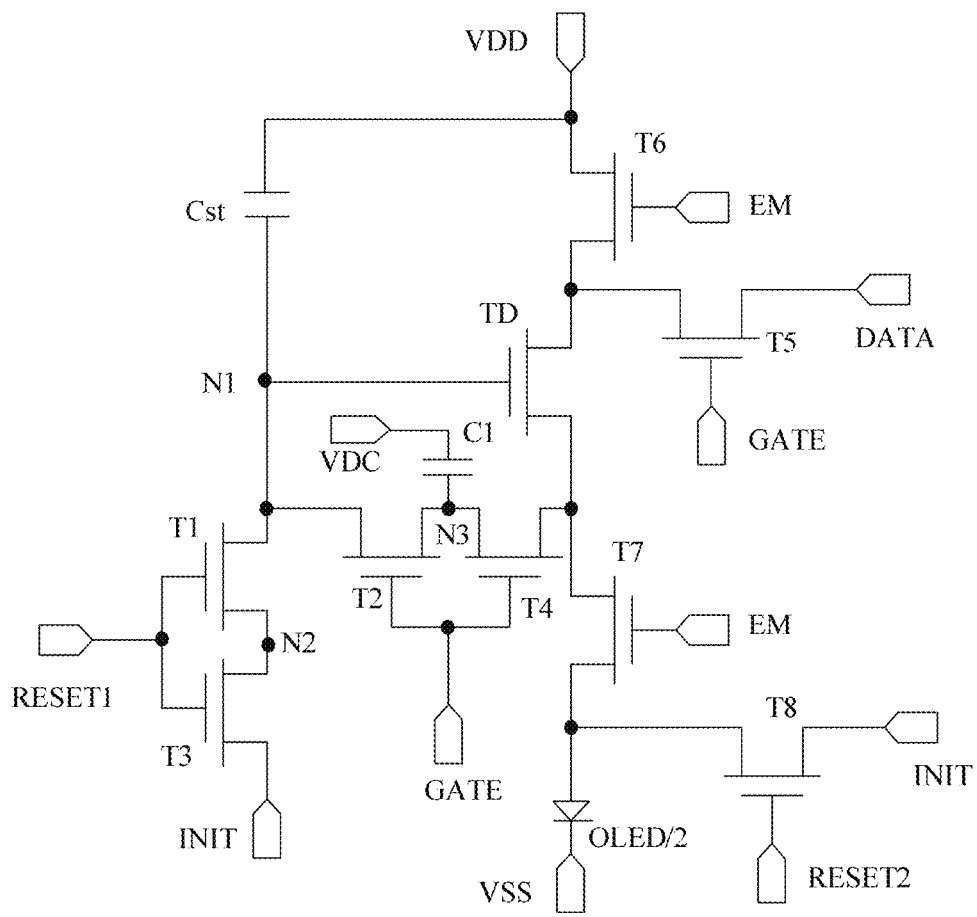
FIG. 7 is a circuit diagram of a pixel circuit according to an embodiment of the present disclosure.

Referring to FIGS. 4 and 7, the following describes some available specific forms of the pixel circuit of the embodiments of the present disclosure.

In some embodiments, the pixel circuit further includes:
a third transistor T3, a first electrode of the third transistor T3 is coupled to the second electrode of the first transistor T1, and a gate of the third transistor T3 is coupled to a gate of the first transistor T1.

In the embodiments of the present disclosure, the above second node N2 may be a node between the first transistor T1 and the third transistor T3, and the gates of the first transistor T1 and the third transistor T3 are coupled to each other, so that the two transistors constitute a "double gate transistor", that is, the second node N2 may be an intermediate node between two gates of the double gate transistor.

In some embodiments, the pixel circuit further includes:
a fourth transistor T4, a first electrode of the fourth transistor T4 is coupled to the second electrode of the second transistor T2, and a gate of the fourth transistor T4 is coupled to a gate of the second transistor T2.

In the embodiments of the present disclosure, the above third node N3 may be a node between the second transistor T2 and the fourth transistor T4, and the gates of the second transistor T2 and the fourth transistor T4 are coupled to each other, so that the two transistors constitute a "double gate transistor", that is, the third node N3 may be an intermediate node between two gates of the double gate transistor.

An intermediate node of a double gate transistor is usually not directly coupled to other signal sources, so that the ability to maintain its own voltage at the intermediate node is weak, which is more suitable for adopting the voltage stabilizing capacitor C1 of the embodiments of the present disclosure.

In some embodiments, the light emitting module includes a light emitting device 2.

The driving module includes a driving transistor TD, and the driving transistor TD is configured to drive the light emitting device 2 to emit light based on the voltage of the gate of the driving transistor TD.

The storage module includes a storage capacitor Cst. A first electrode of the storage capacitor Cst is coupled to the gate of the driving transistor TD. The storage capacitor Cst is configured to maintain the driving voltage of the first electrode of the storage capacitor Cst and provide the driving voltage to the driving module in the luminescence stage.

In some embodiments, the light emitting device 2 is an organic light emitting diode OLED.

As an implementation of the embodiments of the present disclosure, the above driving module may include the driving transistor TD, the storage module may include the storage capacitor Cst, and the light emitting device 2 may be the organic light emitting diode OLED.

In the embodiments of the present disclosure, the organic light emitting diode OLED is taken as an example of the light emitting device 2. Of course, it is also available if the light emitting device 2 is of any other form.

In some embodiments, the pixel circuit includes a first reset module and a writing module.

The first reset module is configured to reset the voltage of the gate of the driving transistor TD based on the signals from an initialization signal terminal INIT and a first reset signal terminal RESET1. The first reset module includes the first transistor T1 and a third transistor T3. A first electrode of the third transistor T3 is coupled to the second electrode of the first transistor T1, a second electrode of the third transistor T3 is coupled to the initialization signal terminal INIT, and a gate of the third transistor T3 is coupled to the gate of the first transistor T1 and the first reset signal terminal RESET1.

The writing module is configured to write the driving voltage to the first electrode of the storage capacitor Cst based on signals from a gate signal terminal GATE and a data signal terminal DATA. The writing module includes: the second transistor T2, the fourth transistor T4, a fifth transistor T5 and a sixth transistor T6. The first electrode of the fourth transistor T4 is coupled to the second electrode of the second transistor T2, a second electrode of the fourth transistor T4 is coupled to a second electrode of the driving transistor TD, and the gate of the fourth transistor T4 is coupled to the gate of the second transistor T2 and the gate signal terminal GATE. A first electrode of the fifth transistor T5 is coupled to a first electrode of the driving transistor TD, a second electrode of the fifth transistor T5 is coupled to the data signal terminal DATA, and a gate of the fifth transistor T5 is coupled to the gate signal terminal GATE. A first electrode of the sixth transistor T6 is coupled to a first power supply signal terminal VDD, a second electrode of the sixth transistor T6 is coupled to the first electrode of the driving transistor TD, and a gate of the sixth transistor T6 is coupled to a control signal terminal EM.

The driving transistor TD and the light emitting device 2 are connected in series between the first power supply signal terminal VDD and a second power supply signal terminal VSS.

A second electrode of the storage capacitor Cst is coupled to the first power supply signal terminal VDD.

A second electrode of the light emitting device 2 is coupled to the second power supply signal terminal VSS.

The first power supply signal terminal VDD and the second power supply signal terminal VSS are used to provide an operating voltage for luminescence of the light emitting device 2.

For example, a first power supply signal Vdd, or a positive voltage signal, may be provided from the first power supply signal terminal VDD; while a second power supply signal Vss, or a negative voltage signal (e.g., a grounding signal) may be provided from the second power supply signal terminal VSS. Therefore, a first electrode of the light emitting device 2 may be a positive electrode (e.g., an anode of the organic light emitting diode OLED), and the second electrode of the light emitting device 2 may be a negative electrode (e.g., a cathode of the organic light emitting diode OLED).

In some embodiments, the pixel circuit further includes a control module configured to control whether the light emitting device 2 emits light based on signals from the control signal terminal EM. The control module includes: a seventh transistor T7. A first electrode of the seventh transistor T7 is coupled to the second electrode of the driving transistor TD, a second electrode of the seventh transistor T7 is coupled to the first electrode of the light emitting device 2, and a gate of the seventh transistor T7 is coupled to the control signal terminal EM.

In some embodiments, the pixel circuit further includes a second reset module configured to reset the voltage of the first electrode of the light emitting device 2 based on signals from a second reset signal terminal RESET2 and the initialization signal terminal INIT. The second reset module includes an eighth transistor T8. A first electrode of the eighth transistor T8 is coupled to the first electrode of the light emitting device 2, a second electrode of the eighth transistor T8 is coupled to the initialization signal terminal INIT, and a gate of the eighth transistor T8 is coupled to the second reset signal terminal RESET2.

As an implementation of the embodiments of the present disclosure, the pixel circuit may further include other modules, such as the control module, the second reset module, and the like.

In some embodiments, each of the driving transistor TD, the first transistor T1, the second transistor T2, the third transistor T3, the fourth transistor T4, the fifth transistor T5, the sixth transistor T6, the seventh transistor T7, and the eighth transistor T8 is a P-type transistor; or, each of the driving transistor TD, the first transistor T1, the second transistor T2, the third transistor T3, the fourth transistor T4, the fifth transistor T5, the sixth transistor T6, the seventh transistor T7 and the eighth transistor T8 is an N-type transistor.

When the pixel circuit is of the above specific form, all the above transistors may be N-type transistors or P-type transistors for convenience.

In some embodiments, the constant voltage signal source VDC is coupled to any one of the initialization signal terminal INIT, the first power supply signal terminal VDD, and the second power supply signal terminal VSS.

When the pixel circuit is of the above specific form, the constant voltage signal source VDC coupled to the second electrode of the voltage stabilizing capacitor C1 may be the existing signal source in the pixel circuit, such as the initialization signal terminal INIT (i.e., the voltage at the third node N3 is stabilized as an initialization signal Vinit), the first power supply signal terminal VDD (i.e., the voltage at the third node N3 is stabilized as the first power supply signal Vdd), the second power supply signal terminal VSS (i.e., the voltage at the third node N3 is stabilized as the second power supply signal Vss), etc, which will not be described in detail herein.

The driving method and operating principle of the above pixel circuit are described below.

In a second aspect, referring to FIG. 4 to FIG. 8, the embodiments of the present disclosure provides a driving method of a pixel circuit. The pixel circuit is any of the above pixel circuits, and the driving method of the pixel circuit includes: in the luminescence stage, maintaining the driving voltage and providing the driving voltage to the driving module by the storage module.

In the embodiments of the present disclosure, in the luminescence stage, the driving voltage is maintained by the storage module, and is provided to the driving module to drive the light emitting device 2 to emit light.

In the embodiments of the present disclosure, since the voltage stabilizing capacitor C1 is included in the pixel circuit, the driving voltage in the luminescence stage has better stability, the brightness change of the light emitting device 2 is small, the flicker phenomenon can be improved or avoided, and the display quality can be enhanced.

In the display period, the driving procedure (i.e., the driving method) of the pixel circuit can be performed many times (i.e., periodically), and each driving procedure includes a plurality of stages.

In some embodiments, the driving method of the pixel circuit includes the following stages: continuously providing the initialization signal to the initialization signal terminal INIT, the first power supply signal to the first power supply signal terminal VDD, and the second power signal to the second power supply signal terminal VSS; in the reset stage, providing the turn-on signal to the first reset signal terminal RESET1, the turn-off signal to the gate signal terminal GATE, and the turn-off signal to the control signal terminal EM; in the writing stage, providing the turn-off signal to the first reset signal terminal RESET1, the turn-on signal to the gate signal terminal GATE, the turn-off signal to the control signal terminal EM, and the data signal to the data signal terminal DATA; and in the luminescence stage, providing the turn-off signal to the first reset signal terminal RESET1, the turn-off signal to the gate signal terminal GATE, and the turn-on signal to the control signal terminal EM.

In some embodiments, the driving method of the pixel circuit includes: in the reset stage, providing the turn-off signal to the second reset signal terminal RESET2; in the writing stage, providing the turn-on signal to the second reset signal terminal RESET2; and in the luminescence stage, providing the turn-off signal to the second reset signal terminal RESET2.

In some embodiments, in each stage of the above driving procedure, corresponding signals may be provided to the signal terminals in the above manner to drive the pixel circuit.

Since the signal at the second reset signal terminal RESET2 is always the same as the signal at the gate signal terminal GATE, the second reset signal terminal RESET2 and the gate signal terminal GATE of the pixel circuit may be coupled to a same signal source, e.g., coupled to a same pin on a driving IC (Driver IC).

Figure 5:
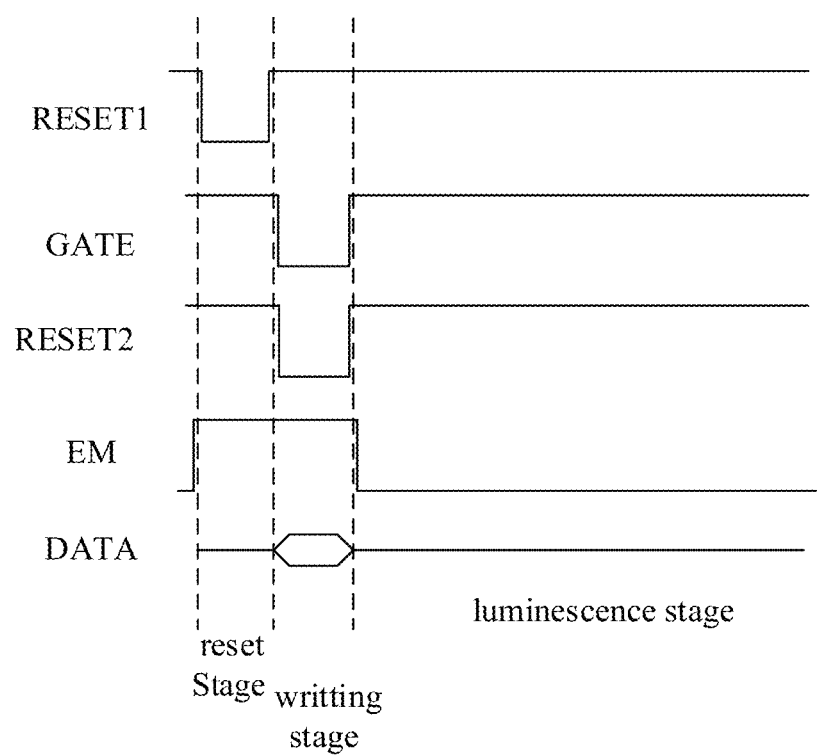
FIG. 5 is a driving timing diagram illustrating a pixel circuit according to an embodiment of the present disclosure.

Referring to FIG. 4 and FIG. 5, as an implementation of the embodiments of the present disclosure, the following describes the driving method of the pixel circuit in the embodiments of the present disclosure by taking the driving transistor TD, the first transistor T1, the second transistor T2, the third transistor T3, the fourth transistor T4, the fifth transistor T5, the sixth transistor T6, the seventh transistor T7 and the eighth transistor T8 as P-type transistors.

In each stage of the driving procedure of the pixel circuit of the embodiments of the present disclosure, the initialization signal Vinit is continuously provided to the initialization signal terminal INIT, the first power supply signal Vdd is continuously provided to the first power supply signal terminal VDD, and the second power supply signal Vss is continuously provided to the second power supply signal terminal VSS. The signals provided to other signal terminals in each stage are as follows.

In a reset stage S101, a low level signal is provided to the first reset signal terminal RESET1, a high level signal is provided to the gate signal terminal GATE, a high level signal is provided to the control signal terminal EM, and a high level signal is provided to the second reset signal terminal RESET2.

In this stage, the first transistor T1 and the third transistor T3 are turned on by the low level signal of the first reset signal terminal RESET1, so that the initialization signal Vinit is written to the first node N1 and the second node N2.

In a writing stage S102, a high level signal is provided to the first reset signal terminal RESET1, a low level signal is provided to the gate signal terminal GATE, a high level signal is provided to the control signal terminal EM, a data signal is provided to the data signal terminal DATA, and a low level signal is provided to the second reset signal terminal RESET2.

In this stage, the second transistor T2, the fourth transistor T4 and the fifth transistor T5 are turned on by the low level signal of gate signal terminal GATE, so that the data signal Vdata from the data signal terminal DATA is written into the first electrode of the driving transistor TD through the fifth transistor T5. After the data signal Vdata passes through the driving transistor TD, the voltage at the first node N1 (i.e., the first electrode of the storage capacitor Cst) is changed to Vdata-Vth, where Vth is a threshold voltage of the driving transistor TD.

The above data signal refers to the data signal corresponding to the pixel circuit. At the other stages of the driving procedure, the data signals corresponding to other pixel circuits may actually reach the data signal terminal DATA (because other pixel circuits may be in the writing stage), but since the fifth transistor T5 is turned off at the other stages, these data signals will not be written into the pixel circuit.

Meanwhile, since the low level signal is provided to the second reset signal terminal RESET2, the initialization signal Vinit from the initialization signal terminal INIT is written into the first electrode of the light emitting device 2 through the eighth transistor T8 to reset the voltage at this position.

In the luminescence stage S103, a high level signal is provided to the first reset signal terminal RESET1, a high level signal is provided to the gate signal terminal GATE, a low level signal is provided to the control signal terminal EM, and a high level signal is provided to the second reset signal terminal RESET2.

In this stage, the low level signal is provided to the control signal terminal EM, so that the sixth transistor T6 and the seventh transistor T7 are turned on. A current may flow from the first power supply signal terminal VDD to the second power supply signal terminal VSS, and the light emitting device 2 may continue to emit light until a next reset stage (in a next frame).

Due to the holding effect of the storage capacitor Cst, the voltage (i.e., the driving voltage) of the gate (i.e., the first node N1) of the driving transistor TD is maintained at Vdata−Vth in this stage. Since the voltage of the first electrode of the driving transistor TD is the first power supply signal Vdd, a gate-source voltage Vgs is Vdata−Vth. The driving current Ioled flowing through the driving transistor TD is proportional to the difference between the gate-source voltage Vgs and the threshold voltage Vth, that is, the driving current Ioled is proportional to Vdd−(Vdata−Vth)−Vth=Vdd−Vdata. It can be seen that the driving current Ioled is only related to the data voltage Vdata, but has nothing to do with the threshold voltage Vth of the driving transistor TD, which eliminates the influence of the threshold voltage drift.

In the embodiments of the present disclosure, in the luminescence stage, the voltage at the third node N3 is usually higher than the voltage Vdata-Vth at the first node N1, so that the voltage at the third node N3 will "pull up" the voltage of the first node N1 due to the leakage current in the second transistor T2, resulting in gradual increasing of the voltage at the first node N1 in the luminescence stage and gradual decreasing of the brightness of the light emitting device 2.

In the embodiments of the present disclosure, since the voltage stabilizing capacitor C1 is provided, the voltage at the third node N3 is more stable and may be maintained at a "lower" level, the "pull up" to the first node N1 is weakened, so that the voltage at the first node N1 is more stable in the luminescence stage and the brightness of the light emitting device 2 is more stable.

Specifically, when entering the luminescence stage, the signal at the gate terminal GATE is changed from a low level signal to a high level signal by "voltage jump" to turn off the second transistor T2 and the fourth transistor T4. It can be seen that the gate signal terminal GATE is coupled to the gates of the second transistor T2 and the fourth transistor T4, and the third node N3 is coupled to the second electrode of the second transistor T2 and the first electrode of the fourth transistor T4, so that the distance between the third node N3 and the gate signal terminal GATE is usually very small.

Thus, the above "voltage jump" of the voltage at the gate signal terminal GATE will also pull up the voltage at the third node N3 due to the coupling effect.

In the embodiments of the present disclosure, the influence of the "voltage jump" of the signal at the gate signal terminal GATE on the voltage at the third node N3 is weakened due to the voltage stabilizing capacitor C1. The lower level of the initialization voltage at the third node N3 at the beginning of the luminescence stage may weaken its "pull-up" on the voltage at the first node N1, thereby enhancing the display quality.

Figure 8:
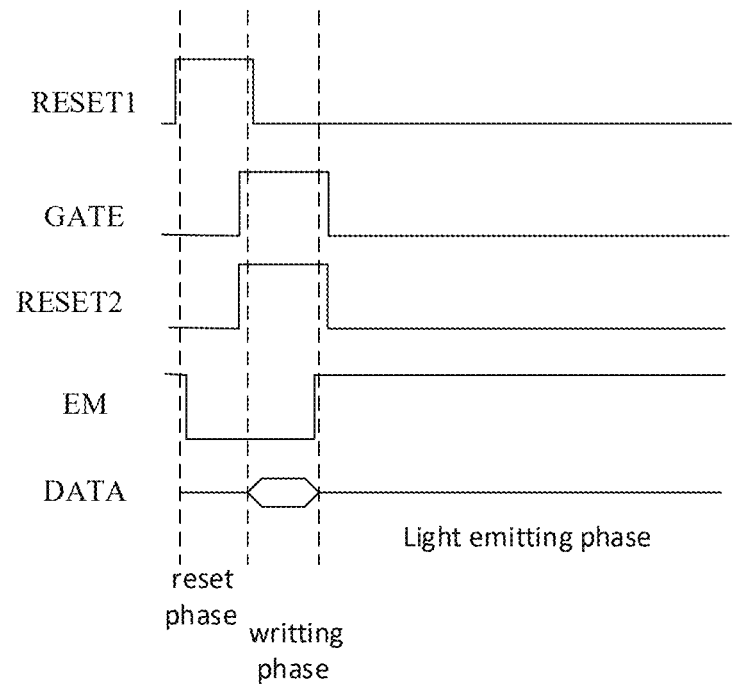
FIG. 8 is a driving timing diagram illustrating a pixel circuit according to an embodiment of the present disclosure.

Referring to FIG. 7 and FIG. 8, as another implementation of the embodiments of the present disclosure, the following describes the driving method of the pixel circuit in the embodiments of the present disclosure by taking the driving transistor TD, the first transistor T1, the second transistor T2, the third transistor T3, the fourth transistor T4, the fifth transistor T5, the sixth transistor T6, the seventh transistor T7 and the eighth transistor T8 as N-type transistors.

In each stage of the driving procedure of the pixel circuit of the embodiments of the present disclosure, the initialization signal Vinit is continuously provided to the initialization signal terminal INIT, the first power supply signal Vdd is continuously provided to the first power supply signal terminal VDD, and the second power supply signal Vss is continuously provided to the second power supply signal terminal VSS. The signals provided to other signal terminals in each stage are as follows.

In a reset stage S201, a high level signal is provided to the first reset signal terminal RESET1, a low level signal is provided to the gate signal terminal GATE, a low level signal is provided to the control signal terminal EM, and a low level signal is provided to the second reset signal terminal RESET2.

In this stage, the first transistor T1 and the third transistor T3 are turned on by the high level signal from the first reset signal terminal RESET1, so that the initialization signal Vinit is written to the first node N1 and the second node N2.

In a writing stage S202, a low level signal is provided to the first reset signal terminal RESET1, a high level signal is provided to the gate signal terminal GATE, a low level signal is provided to the control signal terminal EM, a data signal is provided to the data signal terminal DATA, and a high level signal is provided to the second reset signal terminal RESET2.

In this stage, the second transistor T2, the fourth transistor T4 and the fifth transistor T5 are turned on by the high level signal of gate signal terminal GATE, so that the data signal Vdata from the data signal terminal DATA is written into the first electrode of the driving transistor TD through the fifth transistor T5. After the data signal Vdata passes through the driving transistor TD, the voltage at the first node N1 (i.e., the first electrode of the storage capacitor Cst) is changed to Vdata-Vth, where Vth is the threshold voltage of the driving transistor TD.

The above data signal refers to the data signal corresponding to the pixel circuit. At the other stages of the driving procedure, the data signals corresponding to other pixel circuits may actually reach the data signal terminal DATA (because other pixel circuits may be in the writing stage), but since the fifth transistor T5 is turned off at the other stages, these data signals will not be written into the pixel circuit.

Meanwhile, since the high level signal is provided to the second reset signal terminal RESET2, the initialization signal Vinit of the initialization signal terminal INIT is written into the first electrode of the light emitting device 2 through the eighth transistor T8 to reset the voltage at this position.

In the luminescence stage S203, a low level signal is provided to the first reset signal terminal RESET1, a low level signal is provided to the gate signal terminal GATE, a high level signal is provided to the control signal terminal EM, and a low level signal is provided to the second reset signal terminal RESET2.

In this stage, the high level signal is provided to the control signal terminal EM, so that the sixth transistor T6 and the seventh transistor T7 are turned on. A current may flow from the first power supply signal terminal VDD to the second power supply signal terminal VSS, and the light emitting device 2 may continue to emit light until a next reset phase (in a next frame).

Due to the holding effect of the storage capacitor Cst, the voltage (i.e., the driving voltage) of the gate (i.e., the first node N1) of the driving transistor TD is maintained at Vdata-Vth in this stage. Since the voltage of the first electrode of the driving transistor TD is the first power signal Vdd, a gate-source voltage Vgs is Vdata-Vth. The driving current Ioled flowing through the driving transistor TD is proportional to the difference between the gate-source voltage Vgs and the threshold voltage Vth, that is, the driving current Ioled is proportional to Vdd-(Vdata-Vth)-Vth=Vdd-Vdata. It can be seen that the driving current Ioled is only related to the data voltage Vdata, but has nothing to do with the threshold voltage Vth of the driving transistor TD, which eliminates the influence of the threshold voltage drift.

It can be seen that when the transistors are different forms, only the levels of the turn-on signal and the turn-off signal are exchanged with each other, and the specific driving process and principle of the pixel circuit of the embodiments of the present disclosure are the same, which will not be described in detail herein.

In a third aspect, referring to FIG. 4 to FIG. 21, the embodiments of the present disclosure provides a display substrate. The display substrate includes: a base substrate; and a plurality of sub pixels on the base substrate. At least some of the plurality of sub pixels includes any of the above pixel circuits.

The base substrate is a basis for supporting other structures on the display substrate. The base substrate is basically a sheet structure made of glass, silicon (e.g., monocrystalline silicon), polymer materials (e.g., polyimide), etc., which may be rigid or flexible and has a thickness of millimeter order.

A sub-pixel refers to a minimum structure that may be used to independently display desired contents, i.e., a minimum "dot" that may be independently controlled in a display apparatus. Different sub-pixels may emit light of different colors, so that a color display may be achieved by light mixing from different sub-pixels. A plurality of sub-pixels of different colors arranged together may form one "pixel (or pixel unit)", that is, light emitted by these sub-pixels is mixed together to form a "dot" visually. For example, three sub-pixels of three colors of red, green and blue may form one pixel, or instead of adopting distinct pixels (or pixel units), the color display may be achieved by "sharing" a sub-pixel between adjacent sub-pixels.

In the embodiments of the present disclosure, the devices of the above pixel circuits may be provided on the base substrate, and one pixel circuit corresponds to one sub-pixel. That is, the light emitted by the light emitting device 2 in the pixel circuit is regarded as the light emitted by the sub-pixel.

In the pixel circuits corresponding to the sub-pixels of different colors, the light emitting devices 2 of different colors may directly emitting light of different colors; or all the light emitting devices may emit white light, and the white light is filtered by color filters (CFs) of different colors to be transferred light of different colors.

Since the above pixel circuits are adopted, the display substrate of the embodiments of the present disclosure has stable brightness, no flicker phenomenon and excellent display quality.

In some embodiments, the sub-pixels may be arranged in an array on the display substrate, and the pixel circuit in each of the sub-pixels is provided with signals through a plurality of signal lines to control display of the sub-pixel.

The signal lines may include a plurality of gate signal lines extending in a first direction (e.g., a row direction), a plurality of first reset signal lines extending in the first direction, a plurality of second reset signal lines extending in the first direction, a plurality of control signal lines extending in the first direction, and a plurality of initialization signal lines extending in the first direction. Each of the gate signal lines is coupled to the gate signal terminals GATE of the pixel circuits of the sub-pixels in one row, each of the first reset signal lines is coupled to the first reset signal terminals RESET1 of the pixel circuits of the sub-pixels in one row, each of the second reset signal lines is coupled to the second reset signal terminals RESET2 of the pixel circuits of the sub-pixels in one row (and the second reset signal line and the gate signal line corresponding the sub-pixels in a same row may be coupled to a same signal source), each of the control signal lines is coupled to the control signal terminals EM of the pixel circuits of the sub-pixels in one row, and each of the initialization signal lines is coupled to the initialization signal terminals INIT of the pixel circuits of the sub-pixels in one row.

The signal lines may further include a plurality of data lines extending in the second direction (e.g., a column direction), and each of the plurality of data lines is coupled to the data signal terminals DATA of the pixel circuits of the sub-pixels in one row.

The signal lines may further include first power supply signal lines, second power supply signal lines, initialization signal lines, and the like. These signal lines may extend in the row direction or in the column direction, or may also form a grid, and are respectively coupled to the first power supply signal terminal VDD, the second power supply signal terminal VSS, and the initialization signal terminal INIT of the pixel circuits of the sub-pixels.

In some embodiments, the capacitance of the voltage stabilizing capacitor C1 is 3 fF (femto farad) or more.

Obviously, if the capacitance of the voltage stabilizing capacitor C1 is too small, the voltage at the third node N3 cannot be stabilized. It has been found out that, if the capacitance of the voltage stabilizing capacitor C1 is 3 fF or more, and further 5 fF or more, the voltage at the third node N3 can be better stabilized.

In some embodiments, the first electrode of the voltage stabilizing capacitor C1 and the second electrode of the second transistor T2 are in a same layer and coupled to each other as a piece.

The structures of the pixel circuits on the base substrate may be provided in different layers. Since the first electrode of the voltage stabilizing capacitor C1 needs to be coupled to the second electrode of the second transistor T2, referring to FIG. 10 and FIG. 11, as an implementation of the embodiments of the present disclosure, the first electrode of the voltage stabilizing capacitor C1 and the second electrode of the second transistor T2 may be in a same layer and formed as a piece, so as to simplify the structure and manufacturing method of the display substrate.

Figure 10:
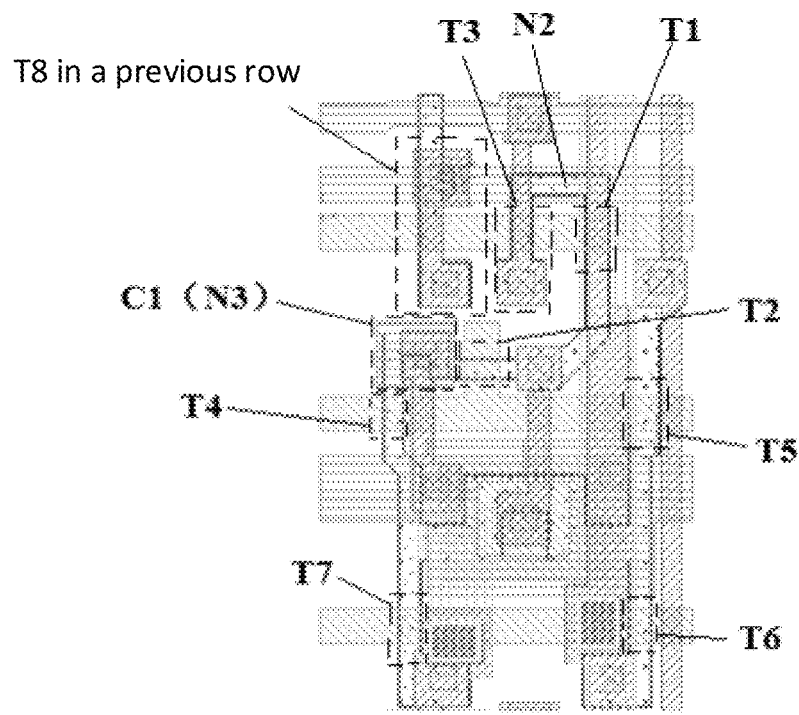
FIG. 10 is a perspective diagram illustrating parts of a structure of a pixel circuit in a display substrate according to an embodiment of the present disclosure.
Figure 11:
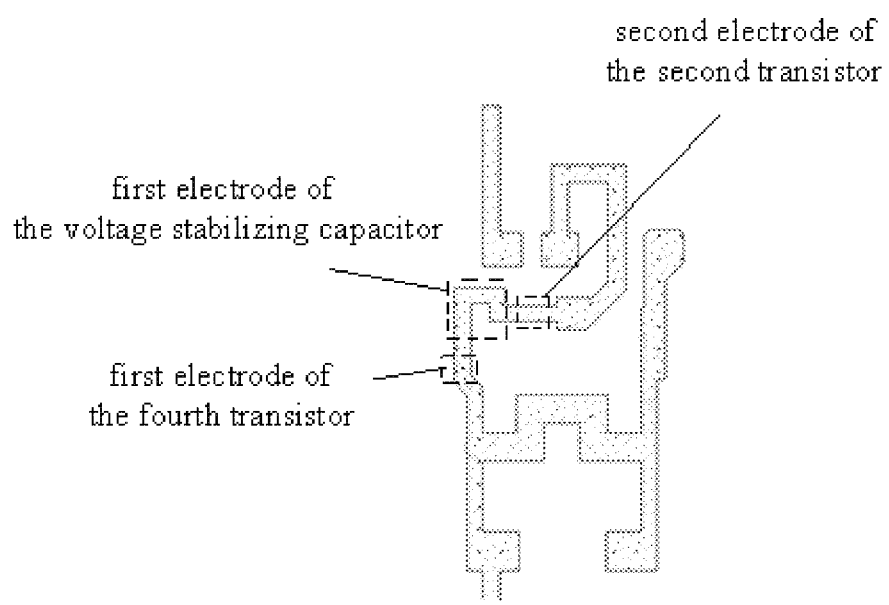
FIG. 11 is a schematic diagram illustrating a structure of a POLY layer of a pixel circuit in a display substrate according to an embodiment of the present disclosure.

When the first electrode of the fourth transistor T4 is also coupled to the first electrode of the voltage stabilizing capacitor C1, referring to FIG. 10 and FIG. 11, the first electrode of the voltage stabilizing capacitor C1, the second electrode of the second transistor T2 and the first electrode of the fourth transistor T4 may be formed as a piece.

In some embodiments, the first electrode of the voltage stabilizing capacitor C1 is provided in the same layer as the active region of the driving transistor TD, and the first electrode of the voltage stabilizing capacitor C1 is made of a conductive semiconductor material.

The second electrode of the second transistor T2 is provided in the same layer as the active region of the driving transistor TD, and the second electrode of the second transistor T2 is made of a conductive semiconductor material.

Referring to FIG. 10 and FIG. 11, in order to further simplify the structures, the structure as a piece composed of the first electrode of the voltage stabilizing capacitor C1 and the second electrode of the second transistor T2 (also including the first electrode of the fourth transistor T4), and the active region of the second transistor T2 (perhaps including the active region of the fourth transistor T4), may be formed as a piece. That is to say, these structures (the first electrode of the voltage stabilizing capacitor C1, the second electrode of the second transistor T2, the first electrode of the fourth transistor T4, the active region of the second transistor T2 and the active region of the fourth transistor T4) are all made of a semiconductor material (e.g., polysilicon). However, the first electrode of the voltage stabilizing capacitor C1, the second electrode of the second transistor T2, and the first electrode of the fourth transistor T4 need to be conducted to be conductive.

Of course, it is available if the first electrode of the second transistor T2 and the second electrode of the fourth transistor T4 are also coupled to and formed as a piece with the above structures.

Of course, it is available if the first electrode of the voltage stabilizing capacitor C1, the second electrode of the second transistor T2, the first electrode of the fourth transistor T4, the active region of the second transistor T2 and the active region of the fourth transistor T4 are respectively provided in different layers, and coupled to each other through the structures, such as via holes in the insulating layer.

In some embodiments, the first electrode of the voltage stabilizing capacitor C1 includes a connection portion 11, coupled to and between the second electrode of the second transistor T2 and the first electrode of the fourth transistor T4. The connection portion 11 has a plurality of bending structures.

Obviously, the first electrode of the fourth transistor T4 and the second electrode of the second transistor T2 are coupled to each other, thereby forming a "double gate transistor". Referring to FIG. 10 and FIG. 11, the connection structure (i.e., the connection portion 11) between the first electrode of the fourth transistor T4 and the second electrode of the second transistor T2 may be directly used as the first electrode of the voltage stabilizing capacitor C1. That is, the first electrode of the fourth transistor T4 and the second electrode of the second transistor T2 are coupled to each other through the first electrode of the voltage stabilizing capacitor C1.

However, referring to FIG. 10 and FIG. 11, since the distance between the second electrode of the second transistor T2 and the first electrode of the fourth transistor T4 is small, if the second electrode of the second transistor T2 and the first electrode of the fourth transistor T4 are coupled to each other directly through the connection portion 11, the connection portion 11 may have a relatively small area, and a corresponding voltage stabilizing capacitor C1 may have a small capacitance, resulting in poor voltage stability. Therefore, the above connection portion 11 (i.e., the first electrode of the voltage stabilizing capacitor C1) may include a plurality of bending structures, so that both the connection between the second electrode of the second transistor T2 and the first electrode of the fourth transistor T4 is achieved, and the area of the connection portion 11 is expanded to increase the capacitance of the voltage stabilizing capacitor C1 within a limited range.

Of course, the first electrode of the voltage stabilizing capacitor C1 is not limited in the above bending structures and the connection portion 11, and the first electrode of the voltage stabilizing capacitor C1 may be of other forms.

For example, the area of the connection portion 11 may also be increased by "thickening", "extending" and the like. Alternatively, the first electrode of the voltage stabilizing capacitor C1 may not be the connection portion 11, but an additional structure coupled to the third node N1 or the like.

In some embodiments, the second electrode of the voltage stabilizing capacitor C1 is provided in the same layer as the initialization signal terminal INIT.

Obviously, the second electrode of the voltage stabilizing capacitor C1 should overlap with and be insulated from the first electrode of the voltage stabilizing capacitor C1. That is, an orthographic projection of the first electrode of the voltage stabilizing capacitor C1 on the substrate overlaps with an orthographic projection of the second electrode of the voltage stabilizing capacitor C1 on the base substrate, and the first electrode of the voltage stabilizing capacitor C1 is separated from the second electrode of the voltage stabilizing capacitor C1 by at least one insulating layer.

Figure 13:
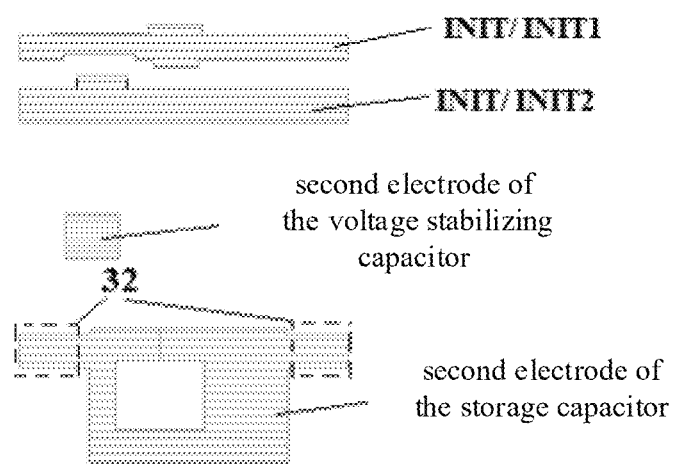
FIG. 13 is a schematic diagram illustrating a structure of a second gate layer of a pixel circuit in a display substrate according to an embodiment of the present disclosure.
Figure 14:
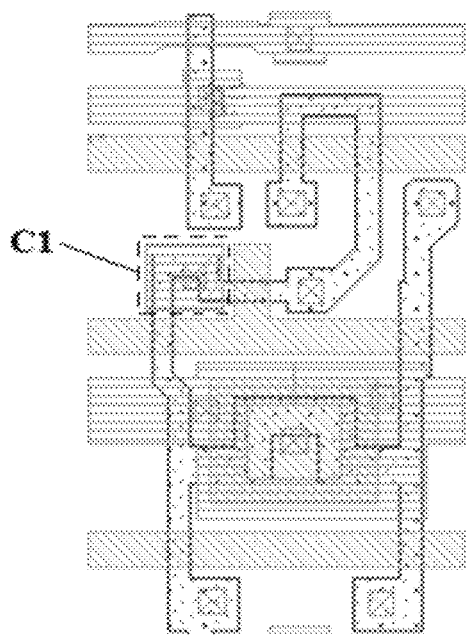
FIG. 14 is a perspective diagram illustrating a structure of a voltage stabilizing capacitor of a pixel circuit in a display substrate according to an embodiment of the present disclosure.

Therefore, as an implementation of the embodiments of the present disclosure, referring to FIG. 10, FIG. 13 and FIG. 14, a structure in the same layer as the initialization signal terminal INIT may be used as the second electrode of the voltage stabilizing capacitor C1.

In some embodiments, in a direction gradually far away from the base substrate, the display substrate successively includes: the active region of the driving transistor TD and the first electrode of the voltage stabilizing capacitor C1; a gate insulating layer (GI); the gate of the driving transistor TD; a first interlayer insulating layer (ILD1); and the second electrode of the voltage stabilizing capacitor C1 and the initialization signal terminal INIT.

A layer (e.g., a GATE2 layer) where the initialization signal terminal INIT is located is close to a layer (e.g., a POLY layer) where the active regions of the transistors are located (due to less insulating layers therebetween). Therefore, the two layers (i.e., the GATE2 layer and the POLY layer) are two layers where the two electrodes of the voltage stabilizing capacitor C1 are located respectively, which can reduce the distance between the two electrodes of the voltage stabilizing capacitor C1 and increase the capacitance of the voltage stabilizing capacitor C1.

Of course, it is also available to use a structure in the same layer as other structures (e.g., the first power supply signal terminal VDD, the second power supply signal terminal VSS, etc.) as the second electrode of the voltage stabilizing capacitor C1.

In some embodiments, the second electrode of the voltage stabilizing capacitor C1 is coupled to the second electrode of the storage capacitor Cst.

As an implementation of the embodiments of the present disclosure, the second electrode of the voltage stabilizing capacitor C1 may be coupled to the second electrode of the storage capacitor Cst through other structures. Since the second electrode of the storage capacitor Cst is necessarily coupled to the first power supply signal terminal VDD, the first power supply signal Vdd is substantially the constant voltage signal of the second electrode of the voltage stabilizing capacitor C1.

In some embodiments, the initialization signal terminal INIT1 includes a first initialization signal terminal INIT1 and a second initialization signal terminal INIT2 in a same layer, and the first initialization signal terminal INIT1 is parallel to and separated from the second initialization signal terminal INIT2.

The second electrode of the eighth transistor T8 is coupled to the first initialization signal terminal INIT1.

The second electrode of the third transistor T3 is coupled to the second initialization signal terminal INIT2.

Referring to FIG. 13, the initialization signal terminal INIT may include two independent structures (the first initialization signal terminal INIT and the second initialization signal terminal INIT2) which are in a same layer. They are respectively coupled to the second electrode of the third transistor T3 and the second electrode of the eighth transistor T8, so that the signal of the second electrodes of the third transistor T3 may be the same as, or different from the signal of the eighth transistor T8 as required, thereby achieving more complex control.

Of course, it is available that the initialization signal terminal INIT coupled to the second electrode of the third transistor T3 and the initialization signal terminal INIT coupled to the second electrode of the eighth transistor T8 is formed as a piece (i.e., the first initialization signal terminal INIT1 is not distinguished from the second initialization signal terminal INIT2).

In some embodiments, the first reset signal terminal RESET1 extends in the first direction.

The first reset signal terminals RESET1 of at least some of the pixel circuits are multiplexed as the second reset signal terminals RESET2 of adjacent pixel circuits in a second direction. The first direction crosses over the second direction.

Referring to FIG. 5 and FIG. 8, the signal at the first reset signal terminal RESET1 differ from the signal at the second reset signal terminal RESET2 by one period. Thus, if the first reset signal terminal RESET1 in the pixel circuit extends in the first direction (a transverse direction as shown in FIG. 12), in adjacent pixel circuits in the second direction (a longitudinal direction as shown in FIG. 12) crossing over (perpendicular to) the first direction, the signal at the second reset signal terminal RESET2 in the pixel circuit in a previous row is the same as the signal at the first reset signal terminal RESET1 of the pixel circuit in current row.

Figure 12:
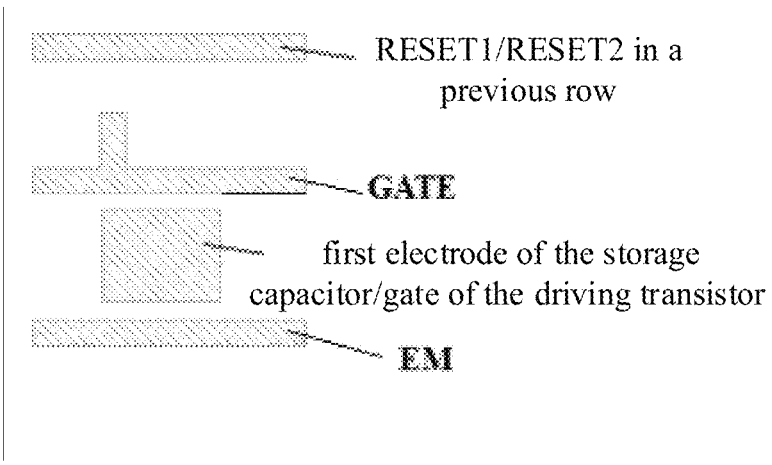
FIG. 12 is a schematic diagram illustrating a structure of a first gate layer of a pixel circuit in a display substrate according to an embodiment of the present disclosure.

Thus, referring to FIG. 12, in order to simplify the structure, the first reset signal terminal RESET1 of each of the pixel circuits may extend in the first direction (i.e., the transverse direction in FIG. 12), and be multiplexed as the second reset signal terminal RESET2 of adjacent pixel circuit in the second direction (i.e., the longitudinal direction in FIG. 12). That is to say, referring to FIG. 10, the eighth transistor T8 of the pixel circuit in a previous row may be located in a same rectangular region with other structures of the pixel circuit in a current row, so that the first reset signal terminal RESET1 of the pixel circuit in the current row (i.e., the second reset signal terminal RESET2 of the of the pixel circuit in the previous row) may be regarded as the gate of the eighth transistor T8 of the pixel circuit in the previous row.

In some embodiments, the second electrode of the storage capacitor Cst includes a transverse connection structure 32 extending in the first direction. Transverse connection structures 32 of at least some of adjacent pixel circuits in the first direction are coupled to each other.

The first power supply signal terminal VDD extends in the second direction, and the first direction crosses over the second direction.

Referring to FIG. 13, in addition to the structure overlapping with the first electrode of the storage capacitor Cst (e.g., a rectangle with a notch in FIG. 13), the second electrode of the storage capacitor Cst further includes a transverse connection structure 32 extending in the first direction (i.e., the transverse direction in FIG. 13), so that a plurality of storage capacitors CST in a same row may be coupled to each other and formed as a piece through the transverse connection structures 32.

Figure 15:
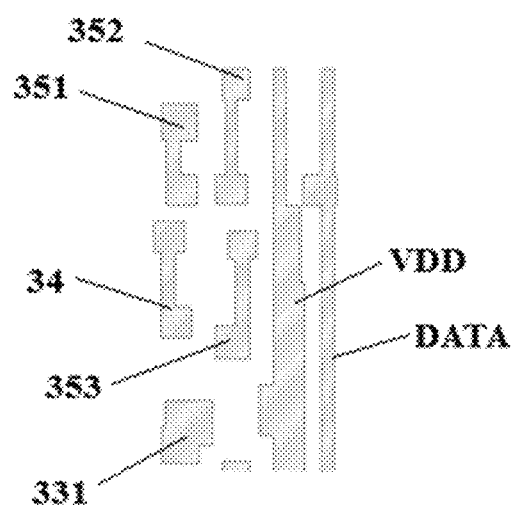
FIG. 15 is a schematic diagram illustrating a structure of a first source-drain layer of a pixel circuit in a display substrate according to an embodiment of the present disclosure.

Meanwhile, referring to FIG. 15, the first power supply signal terminal VDD extends in the second direction (i.e., a longitudinal direction in FIG. 15) crossing over the first direction, and the first power supply signal terminals VDD is necessarily coupled to the storage capacitor Cst in the respective pixel circuit.

It can be seen that the first power supply signal terminals VDD in multiple columns are electrically coupled to the second electrodes of the storage capacitors Cst in a same row. That is, electrically, the structure that provides the first power supply signal Vdd forms a "grid", thus reducing its power supply resistance.

In some embodiments, the display substrate further includes: an auxiliary conductive structure 31 overlapping with the first power supply signal terminal VDD. At least one insulating layer is provided between the auxiliary conductive structure 31 and the first power supply signal terminal VDD, and the auxiliary conductive structure 31 is coupled to the first power supply signal terminal VDD through a via hole in the insulating layer.

Figure 16:
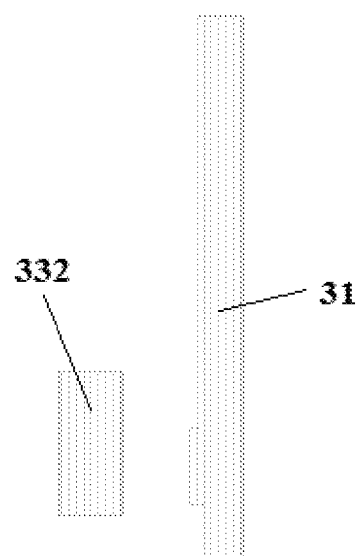
FIG. 16 is a schematic diagram illustrating a structure of a second source-drain layer of a pixel circuit in a display substrate according to an embodiment of the present disclosure.

Referring to FIG. 16, the display substrate may further include an auxiliary conductive structure 31 (e.g., also extending in the second direction) overlapping with the first power supply signal terminal VDD, and the auxiliary conductive structure 31 is coupled to the first power supply signal terminal VDD to further reduce the power supply resistance for the first power signal VDD.

Taking the above pixel circuit as an example, the specific layers of structures thereof will be illustrated.

In some embodiments, in a direction gradually far away from the base substrate, the display substrate successively includes the layers as follows.

(1) Semiconductor Layer (POLY)

The semiconductor layer is made of a semiconductor material, such as a polysilicon material (poly-Si).

The semiconductor layer includes: the first and second electrodes and the active region of the driving transistor TD, the first and second electrodes and the active region of the first transistor T1, the first and second electrodes and the active region of the second transistor T2, the first and second electrodes and the active region of the third transistor T3, the first and second electrodes and the active region of the fourth transistor T4, the first and second electrodes and the active region of the fifth transistor T5, the first and second electrodes and the active region of the sixth transistor T6, the first and second electrodes and the active region of the seventh transistor T7, the first and second electrodes and the active region of the eighth transistor T8, and the first electrode of the voltage stabilizing capacitor C1.

The first electrode of the voltage stabilizing capacitor C1 and the second electrode of the second transistor T2 is coupled to each other and formed as a piece, and both are made of a conductive semiconductor material.

Referring to FIG. 11, the active regions and the first and the second electrodes of the transistors may be located in the semiconductor layer, and the first electrode (i.e., the connection portion 11) of the voltage stabilizing capacitor C1 and the second electrode of the second transistor T2 are coupled to each other as a piece and are also in the semiconductor layer.

Of course, the electrodes of all transistors and the first electrode of voltage stabilizing capacitor C1 are made of a conductive semiconductor material.

(2) Gate Insulating Layer (GI)

The gate insulating layer is made of an insulating material, such as silicon nitride, silicon oxide, silicon oxynitride, etc., and is used to separate the active regions from the gates of the transistors.

Since the active regions of the transistors are closer to the base substrate than the gates thereof, all transistors are bottom gate transistors.

Figure 17:
FIG. 17 is a schematic diagram illustrating a via hole distribution in a gate insulating layer of a pixel circuit in a display substrate according to an embodiment of the present disclosure.
Figure 17:

Referring to FIG. 17, the gate insulating layer may be provided with: a via hole for coupling the first power supply signal terminal VDD to the first electrode of the sixth transistor T1, a via hole for coupling the data signal terminal DATA to the second electrode of the fifth transistor T5, a via hole for coupling a first light emitting access structure 331 to the second electrode of the seventh transistor T7, a via hole for coupling a first connection structure 351 to the second electrode of the eighth transistor T8, a via hole for coupling a second connection structure 352 to the second electrode of the third transistor T3, a via hole for coupling a third connection structure 353 to the first electrode of the first transistor T1, which will be described in detail later.

(3) First Gate Layer (GATE1)

The first gate layer is made of a conductive material, such as a metal material.

The first gate layer is provided with: the gate of the driving transistor TD, the gate of the first transistor T1, the gate of the second transistor T2, the gate of the third transistor T3, the gate of the fourth transistor T4, the gate of the fifth transistor T5, the gate of the sixth transistor T6, the gate of the seventh transistor T7, the gate of the eighth transistor T8, the first reset signal terminal RESET1, the second reset signal terminal RESET2, the control signal terminal EM, and the first electrode of the storage capacitor Cst.

Referring to FIG. 12, the gates of all transistors and the signal terminals for providing signals to the gates may be in the first gate layer.

In addition, the first electrode of the storage capacitor Cst is necessarily coupled to the gate of the transistor TD (e.g., coupled to each other as a piece), and is also in the first gate layer.

As mentioned above, the first reset signal terminal RESET1 of the pixel circuit in the current row may also be multiplexed as the second reset signal terminal RESET2 of the pixel circuit in the previous row. That is, there is substantially only one reset signal terminal in each of the pixel circuits.

(4) First Interlayer Insulating Layer (ILD1)

The first interlayer insulating layer is made of an insulating material, such as silicon nitride, silicon oxide, silicon oxynitride, etc., and is used to separate the first gate layer from the subsequent second gate layer.

Figure 18:
FIG. 18 is a schematic diagram illustrating a via hole distribution in a first interlayer insulating layer of a pixel circuit in a display substrate according to an embodiment of the present disclosure.
Figure 18:
Figure 18:

Referring to FIG. 18, the first interlayer insulating layer may be provided with: a via hole for coupling the first power supply signal terminal VDD to the first electrode of the sixth transistor T1, a via hole for coupling the data signal terminal DATA to the second electrode of the fifth transistor T5, a via hole for coupling the first light emitting access structure 331 to the second electrode of the seventh transistor T7, a via hole for coupling the first connection structure 351 to the second electrode of the eighth transistor T8, a via hole for coupling the second connection structure 352 to the second electrode of the third transistor T3, a via hole for coupling the third connection structure 353 to the gate of the driving transistor TD, a via hole for coupling the third connection structure 353 to the first electrode of the first transistor T1, which will be described in detail later.

(5) Second Gate Layer (GATE2)

The second gate layer is made of a conductive material, such as a metal material.

The second gate layer is provided with: the initialization signal terminal INIT, the second electrode of the voltage stabilizing capacitor C1 and the second electrode of the storage capacitor Cst.

Referring to FIG. 13, the initialization signal terminal INIT, the second electrode of the voltage stabilizing capacitor C1 and the second electrode of the storage capacitor Cst may be provided in the second gate layer, and the second electrode of the voltage stabilizing capacitor C1 may be coupled to the second electrode of the storage capacitor Cst through a subsequent voltage stabilizing connection structure 34, which will be described in detail later.

Referring to FIG. 13, the initialization signal terminal INIT may further include the above first initialization signal terminal INIT1 and second initialization signal terminal INIT2.

Referring to FIG. 13, the second electrode of the storage capacitor Cst may further include the above transverse connection structure 32.

Referring to FIG. 13, in addition to the transverse connection structure 32, the second electrode of the storage capacitor Cst may be of a rectangle with a notch, through which the first electrode of the storage capacitor Cst below is coupled to the first electrode of the first transistor T1 (which will be described in detail later).

(6) Second Interlayer Insulating Layer (ILD2)

The second interlayer insulating layer is made of an insulating material, such as silicon nitride, silicon oxide, silicon oxynitride, etc., and is used to separate the second gate layer from the subsequent first source-drain layer.

Figure 19:
FIG. 19 is a schematic diagram illustrating a via hole distribution in a second interlayer insulating layer of a pixel circuit in a display substrate according to an embodiment of the present disclosure.
Figure 19:
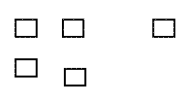
Figure 19:
Figure 19:

Referring to FIG. 19, the second interlayer insulating layer may be provided with: a via hole for coupling the first power supply signal terminal VDD to the second electrode of the storage capacitor Cst, a via hole for coupling the first power supply signal terminal VDD to the first electrode of the sixth transistor T1, a via hole for coupling the data signal terminal DATA to the second electrode of the fifth transistor T5, a via hole for coupling the first light emitting access structure 331 to the second electrode of the seventh transistor T7, a via hole for coupling the first connection structure 351 to the second electrode of the eighth transistor T8, a via hole for coupling the first connection structure 351 to the initialization signal terminal INIT, a via hole for coupling the second connection structure 352 to the second electrode of the third transistor T3, a via hole for coupling the second connection structure 352 to the initialization signal terminal INIT, a via hole for coupling the third connection structure 353 to the gate of the driving transistor TD, a via hole for coupling the third connection structure 353 to the first electrode of the first transistor T1, a via hole for coupling the voltage stabilizing connection structure 34 to the second electrode of the storage capacitor Cst, and a via hole for coupling the voltage stabilizing connection structure 34 to the second electrode of the voltage stabilizing capacitor C1, which will be described in detail later.

(7) First and Source Drain Layer (SD1)

The first source-drain layer is made of a conductive material, such as a metal material.

The first source-drain layer is provided with the first power supply signal terminal VDD, the data signal terminal DATA, the first light emitting access structure 331 and the voltage stabilizing connection structure 34.

The first power supply signal terminal VDD is coupled to the second electrode of the storage capacitor Cst through the via hole extending through the second interlayer insulating layer, and is coupled to the first electrode of the sixth transistor T1 through the via hole extending through the gate insulating layer, the first interlayer insulating layer and the second interlayer insulation layer. The data signal terminal DATA is coupled to the second electrode of the fifth transistor T5 through the via hole extending through the gate insulating layer, the first interlayer insulating layer and the second interlayer insulating layer. The first light emitting access structure 331 is coupled to the second electrode of the seventh transistor T7 through the via hole extending through the gate insulating layer, the first interlayer insulating layer and the second interlayer insulating layer. The voltage stabilizing connection structure 34 is coupled to the second electrode of the storage capacitor Cst through the via hole extending through the second interlayer insulating layer, and is coupled to the second electrode of the voltage stabilizing capacitor C1 through the via hole extending through the second interlayer insulating layer.

Referring to FIG. 15, the first power supply signal terminal VDD and the data signal terminal DATA may be provided in the first source-drain layer, and the first power supply signal terminal VDD is coupled to the second electrode of the storage capacitor Cst, while the data signal terminal DATA is coupled to the second electrode of the fifth transistor T5 to form the above pixel circuit.

The second electrode of the seven transistor T7 is required to be coupled to the first electrode of the light emitting device 2, and there are many layers therebetween and a large distance therebetween. Therefore, referring to FIG. 15, the first source-drain layer may further be provided with the first light emitting access structure 331 coupled to the second electrode of the seven transistor T7, such that the second electrode of the seventh transistor T7 may be coupled to the first electrode of the light emitting device 2 through multiple structures, which will be described in detail late, to avoid broken linesr.

The second electrode of the storage capacitor Cst and the second electrode of the voltage stabilizing capacitor C1 in the second gate layer may be coupled (equivalent to bridging) to each other through the voltage stabilizing connection structure 34 in the first source-drain layer.

In some embodiments, the first source-drain layer may be further provided with: the first connection structure 351, the second connection structure 352 and the third connection structure 353.

The first connection structure 351 is coupled to the second electrode of the eighth transistor T8 through the via hole extending through the gate insulating layer, the first interlayer insulating layer and the second interlayer insulating layer, and is coupled to the initialization signal terminal INIT through the via hole extending through the second interlayer insulating layer.

The second connection structure 352 is coupled to the second electrode of the third transistor T3 through the via hole extending through the gate insulating layer, the first interlayer insulating layer and the second interlayer insulating layer, and is coupled to the initialization signal terminal INIT through the via hole extending through the second interlayer insulating layer.

The third connection structure 353 is coupled to the gate of the driving transistor TD through the via hole extending through the first interlayer insulating layer and the second interlayer insulating layer, and is coupled to the first electrode of the first transistor T1 through the via hole extending through the gate insulating layer, the first interlayer insulating layer and the second interlayer insulating layer.

Referring to FIG. 10 and FIG. 15, in order to achieve the electrical connection between the structures in different layers in the pixel circuit, a plurality of corresponding connection structures may be provided in the first source-drain layer.

The connection structure specifically includes the first connection structure 351 coupling the second electrode of the eighth transistor T8 to the initialization signal terminal INIT (e.g., the first initialization signal terminal INIT1), the second connection structure 352 coupling the second electrode of the third transistor T3 to the initialization signal terminal INIT (e.g., the second initialization signal terminal INIT2); and the third connection structure 353 coupling the driving transistor TD (i.e., the first electrode of the storage capacitor Cst) to the first electrode of the first transistor T1 (e.g., through the above notch in the storage capacitor Cst).

Of course, it is also available if the above connection structures are provided in other layers, or it is also available if different connection structures are needed when the forms of the electrodes of the transistors and the capacitors are changed.

(8) First Planarization Layer (PLN1)

The first planarization layer is made of an organic insulating material for eliminating the segment difference of the underlying structure.

Figure 20:
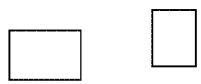
FIG. 20 is a schematic diagram illustrating a via hole distribution in a first planarization layer (i.e., a passivation layer) of a pixel circuit in a display substrate according to an embodiment of the present disclosure.

Referring to FIG. 20, the first planarization layer may be provided with: a via hole for coupling the first light emitting access structure 331 to the second light emitting access structure 332, and a via hole for coupling the first power supply signal terminal VDD to the auxiliary conductive structure 31, which will be described in detail later.

(9) Passivation Layer (PVX)

The passivation layer is made of an insulating material, such as silicon nitride, silicon oxide, silicon oxynitride, etc., to avoid direct contact of the subsequent structure with the first planarization layer.

The passivation layer and the first planarization layer are two continuous insulating layers (or regarded as two sublayers of an insulating layer). Therefore, referring to FIG. 20, the via holes in the passivation layer are exactly the same as those in the first planarization layer (i.e., orthographic projections of the via holes in the passivation layer on the base substrate at least partially overlap with orthographic projections of the via holes in the first planarization layer on the base substrate).

Therefore, in all the descriptions of the embodiments of the present disclosure, the via holes in the first planarization layer may include the via holes in the passivation layer, which will not be described in detail herein.

(10) Second Source-Drain Layer (SD2)

The second source-drain layer is made of a conductive material, such as a metal material.

The second source-drain layer is provided with the auxiliary conductive structure 31 and the second light emitting access structure 332.

The auxiliary conductive structure 31 overlaps with the first power supply signal terminal VDD, and is coupled to the first power supply signal terminal VDD through the via hole extending through the first planarization layer. The second light emitting access structure 332 is coupled to the first light emitting access structure 331 through the via hole extending through the first planarization layer.

The auxiliary conductive structure 31 for reducing the power supply resistance for the first power supply signal Vdd may be in the second source-drain layer, and is coupled to the first power supply signal terminal VDD.

The second source-drain layer may be further provided with the second light emitting access structure 332 coupled to the first light emitting access structure 331, so that the first electrode of the subsequent light emitting device 2 may be coupled to the second electrode of the seventh transistor T7 through the second light emitting access structure 332 and the first light emitting access structure 331.

(11) Second Planarization Layer (PLN2)

The second planarization layer is made of an organic insulating material for eliminating the segment difference of the underlying structure.

Figure 21:
FIG. 21 is a schematic diagram illustrating a via hole distribution in a second planarization layer of a pixel circuit in a display substrate according to an embodiment of the present disclosure.

Referring to FIG. 21, the second planarization layer may be provided with a via hole for coupling the second light emitting access structure 332 to the first electrode of the light emitting device 2, which will be described in detail later.

(12) First Electrode of the Light Emitting Device 2

The first electrode of the light emitting device 2 is coupled to the second light emitting access structure 332 through the via hole extending through the second planarization layer.

The first electrode of the light emitting device 2 may be provided on the second planarization layer, and is coupled to the second electrode of the seventh transistor T7 through the second light emitting access structure 332 and the first light emitting access structure 331.

Specifically, the first electrode of the light emitting device 2 may be the anode of the organic light emitting diode OLED, and the anode may be made of a metal oxide conductive materials, such as indium tin oxide (ITO).

In some embodiments, in a direction far away from the base substrate, the display substrate may further include the following structures in sequence.

(13) Pixel Defining Layer (PDL)

The pixel defining layer is made of an organic insulating material for defining a range for the light emitting device 2 (e.g., an organic light emitting diode OLED) through an opening therein.

(14) Light Emitting Layer of the Light Emitting Device 2

The light emitting layer is a layer for emitting light in the light emitting device 2.

Specifically, the light emitting layer of the light emitting device 2 may be the light emitting layer of the organic light emitting diode OLED. The light emitting layer of the organic light emitting diode (OLED) is made of an organic material. The organic light emitting diode at least includes an organic light emitting layer (EML), and may further include an electron injection layer (EIL), an electron transport layer (ETL), a hole injection layer (HIL), a hole transport layer (HTL) and any other stacked auxiliary layer.

The light emitting layer of the organic light emitting diode OLED may be a whole-layer structure, and is contact with the anode of the organic light emitting diode OLED at the opening of the pixel defining layer to form the organic light emitting diode OLED.

(15) Second Electrode of the Light Emitting Device 2

Specifically, the second electrode of the light emitting device 2 may be the cathode of the organic light emitting diode OLED, and the cathode of the organic light emitting diode OLED may be made of a metal conductive material, such as aluminum.

The cathode of the organic light emitting diode OLED may be formed as a whole layer, and may be alternatively regarded as the second power supply signal terminal VSS.

(16) Encapsulation Layer.

The encapsulation layer may be a laminated structure with organic layers and inorganic layers arranged alternately, and may be used for encapsulating other structures therein, such that the other structures (for example the light emitting layer) therein can be prevented from aging due to contact with water and oxygen in the environment.

The above layer structures may be formed by a solution process and a deposition process. In a case where a structure of a specific shape occurs in the above layer structures, the structure of a specific shape may be formed by a composition process.

Of course, the specific layer structures described above are only schematic, and various changes may be made to the layer structures.

For example, the layers of the specific layer structures may be different. For another example, the gates of the transistors may be in a layer closer to the base substrate than the active regions thereof. That is, the transistors may not be the above "bottom gate transistors", but "top gate transistor".

In a fourth aspect, the embodiment of the present disclosure provides a display apparatus. The display apparatus includes: any of the above display substrates.

The display apparatus with display function may be formed by combining the above display substrate with any other device (e.g., an opposite substrate, a flexible circuit board, a driving chip, a power supply component, etc.).

In some embodiments, the display apparatus is an organic light emitting diode (OLED) display apparatus.

Since the above display substrate is adopted, the display apparatus of the embodiments of the present disclosure has stable brightness, no flicker phenomenon and an excellent display quality.

The present disclosure has disclosed example embodiments, and although specific terms are employed, they are used and should be interpreted in a generic and descriptive sense only and not for purposes of limitation. In some instances, features, characteristics and/or elements described in connection with a particular embodiment may be used alone or in combination with features, characteristics and/or elements described in connection with other embodiments, unless expressly stated otherwise, as would be apparent to one skilled in the art. It will, therefore, be understood by those skilled in the art that various changes in form and detail may be made therein without departing from the scope of the disclosure as set forth in the appended claims.

What is claimed is:

1. A display substrate, comprising:
a base substrate; and
a plurality of sub-pixels on the base substrate, at least some of the sub-pixels comprising a pixel circuit,
wherein the pixel circuit comprises:
a light emitting module configured to emit light;
a driving module configured to drive the light emitting module to emit light based on a driving voltage in a luminescence stage;
a storage module configured to maintain and provide the driving voltage to the driving module in the luminescence stage;
a first transistor having a first electrode connected to a position from which the driving module acquires the driving voltage;
a second transistor having a first electrode connected to the first electrode of the first transistor, and a second electrode being not directly connected to a signal source; and
a voltage stabilizing capacitor having a first electrode connected to the second electrode of the second transistor, and a second electrode connected to a constant voltage signal source;
a third transistor having a first electrode connected to a second electrode of the first transistor, and a gate connected to a gate of the first transistor; and
a fourth transistor having a first electrode connected to the second electrode of the second transistor, and a gate connected to a gate of the second transistor;
wherein the light emitting module comprises a light emitting device;
the driving module comprises a driving transistor configured to drive the light emitting device to emit light based on a voltage at a gate of the driving transistor; and
the storage module comprises a storage capacitor having a first electrode connected to the gate of the driving transistor and configured to maintain the driving voltage at the first electrode of the storage capacitor and provide it to the driving module in the luminescence stage;
wherein the storage capacitor has a second electrode connected to a first power supply signal terminal which is provided with a first power supply signal via a structure forming a grid.

2. The display substrate of claim 1, further comprising a semiconductor layer, a gate insulating layer, a first gate layer, a first interlayer insulating layer, a second gate layer, a second interlayer insulating layer and a first source-drain layer in a direction gradually far away from the base substrate;
wherein the second electrode of the storage capacitor is arranged in the second gate layer, and comprises a traverse connection structure extending in a traverse direction, at least some of transverse connection structures of adjacent pixel circuits in the traverse direction are connected to each other;
the first power supply signal terminal extends in a longitudinal direction, and the first power supply signal terminals of a plurality of columns are arranged in the first source-drain layer, and electrically coupled to the second electrodes of the storage capacitors in a same row, respectively, and the structure that provides the first power supply signal forms the grid; and
the traverse direction crosses over the longitudinal direction.

3. The display substrate of claim 1, wherein the first electrode of the voltage stabilizing capacitor and the second electrode of the second transistor are arranged in a same layer and connected to each other as a single piece.

4. The display substrate of claim 1, wherein the first electrode of the voltage stabilizing capacitor, the second electrode of the second transistor and the first electrode of the fourth transistor are formed as a single piece.

5. The display substrate of claim 3, wherein
the first electrode of the voltage stabilizing capacitor and an active region of the driving transistor are arranged in a same layer, and the first electrode of the voltage stabilizing capacitor is made of a conductive semiconductor material; and
the second electrode of the second transistor and the active region of the driving transistor are arranged in a same layer, and the second electrode of the second transistor is made of a conductive semiconductor material.

6. The display substrate of claim 1, wherein
the first electrode of the voltage stabilizing capacitor, the second electrode and an active region of the second transistor, and the first electrode and an active region of the fourth transistor are arranged in different layers, and
the first electrode of the voltage stabilizing capacitor, the second electrode of the second transistor, and the first electrode of the fourth transistor are connected to each other through at least one via hole in at least one insulating layer between the different layers.

7. The display substrate of claim 1, wherein
the first electrode of the voltage stabilizing capacitor comprises a plurality of bending structures between the second electrode of the second transistor and the first electrode of the fourth transistor.

8. The display substrate of claim 1, wherein
the first electrode of the voltage stabilizing capacitor comprises a structure connected to a node between the second electrode of the second transistor and the first electrode of the fourth transistor.

9. The display substrate of claim 2, wherein the pixel circuit comprises a first reset module;
the first reset module is configured to reset a voltage at the gate of the driving transistor based on signals from an initialization signal terminal and a first reset signal terminal; and the first reset module comprises:
the first transistor;
the third transistor having the first electrode connected to the second electrode of the first transistor, a second electrode connected to the initialization signal terminal, and the gate connected to the gate of the first transistor and the first reset signal terminal;
wherein the driving transistor and the light emitting device are connected in series between the first power supply signal terminal and a second power supply signal terminal; and
a second electrode of the light emitting device is connected to the second power supply signal terminal.

10. The display substrate of claim 9, wherein the second electrode of the voltage stabilizing capacitor and the initialization signal terminal are both arranged in the second gate layer.

11. The display substrate of claim 9, wherein an orthographic projection of the first electrode of the voltage stabilizing capacitor on the base substrate partially overlaps with an orthographic projection of the second electrode of the voltage stabilizing capacitor on the base substrate; and the first electrode of the voltage stabilizing capacitor is arranged in the semiconductor layer, and is separated from the second electrode of the voltage stabilizing capacitor by at least one insulating layer.

12. The display substrate of claim 9, wherein
the pixel circuit further comprises a writing module, and the writing module is configured to write the driving voltage to the first electrode of the storage capacitor based on signals from a gate signal terminal and a data signal terminal; and the writing module comprises:
the second transistor;
the fourth transistor having the first electrode connected to the second electrode of the second transistor, a second electrode connected to a second electrode of the driving transistor, and the gate connected to the gate of the second transistor and the gate signal terminal;
a fifth transistor having a first electrode connected to a first electrode of the driving transistor, a second electrode connected to the data signal terminal, and a gate connected to the gate signal terminal;
a sixth transistor having a first electrode connected to a first power supply signal terminal, a second electrode connected to the first electrode of the driving transistor, and a gate connected to a control signal terminal; and
the pixel circuit further comprises:
a control module configured to control whether the light emitting device emits light based on a signal from the control signal terminal, and comprising a seventh transistor having a first electrode connected to the second electrode of the driving transistor, a second electrode connected to a first electrode of the light emitting device, and a gate connected to the control signal terminal; and
a second reset module configured to reset a voltage at the first electrode of the light emitting device based on a signal from a second reset signal terminal and the signal from the initialization signal terminal, and comprising an eighth transistor having a first electrode connected to the first electrode of the light emitting device, a second electrode connected to the initialization signal terminal, and a gate connected to the second reset signal terminal.

13. The display substrate of claim 12, wherein
the initialization signal terminal comprises a first initialization signal terminal and a second initialization signal terminal both arranged in the second gate layer, and the first initialization signal terminal and the second initialization signal terminal are parallel to each other and separated from each other;
the second electrode of the eighth transistor is connected to the first initialization signal terminal; and
the second electrode of the third transistor is connected to the second initialization signal terminal.

14. The display substrate of claim 12, wherein
the first reset signal terminal extends in the traverse direction; and
first reset signal terminals of at least some of pixel circuits are multiplexed as second reset signal terminals of adjacent pixel circuits in the longitude direction.

15. The display substrate of claim 12, wherein the first source-drain layer further comprises:
a first connection structure, wherein the first connection structure is connected to the second electrode of the eighth transistor through a via hole extending through the gate insulating layer, the first interlayer insulating layer and the second interlayer insulating layer, and is connected to the initialization signal terminal through a via hole extending through the second interlayer insulating layer;
a second connection structure, wherein the second connection structure is connected to the second electrode of the third transistor through a via hole extending through the gate insulating layer, the first interlayer insulating layer and the second interlayer insulating layer, and is connected to the initialization signal terminal through a via hole extending through the second interlayer insulating layer; and
a third connection structure, wherein the third connection structure is connected to the gate of the driving transistor through a via hole extending through the first interlayer insulating layer and the second interlayer insulating layer, and is connected to the first electrode of the first transistor through a via hole extending through a via hole extending through the gate insulating layer, the first interlayer insulating layer and the second interlayer insulating layer.

16. The display substrate of claim 15, wherein the first source-drain layer further comprises the data signal terminal, and at least a part of an orthographic projection of the first power supply terminal on the base substrate is between an orthographic projection of the data signal terminal on the base substrate and an orthographic projection of the third connection structure on the base substrate.

17. The display substrate of claim 12, further comprising:
a first planarization layer; and
a second source-drain layer comprising an auxiliary conductive structure
overlapping with the first power supply signal terminal; at least one insulating layer is provided between the auxiliary conductive structure and the first power supply signal terminal, and the auxiliary conductive structure is connected to the first power supply signal terminal through a via hole extending through the insulating layer.

18. The display substrate of claim 12, wherein the semiconductor layer comprises: the first electrode, the second electrode and the active region of the driving transistor; the first electrode, the second electrode and the active region of the first transistor; the first electrode, the second electrode and the active region of the second transistor; the first electrode, the second electrode and the active region of the third transistor; the first electrode, the second electrode and the active region of the fourth transistor; the first electrode, the second electrode and the active region of the fifth transistor; the first electrode, the second electrode and the active region of the sixth transistor; the first electrode, the second electrode and the active region of the seventh transistor; the first electrode, the second electrode and the active region of the eighth transistor; and the first electrode of the voltage stabilizing capacitor; wherein the first electrode of the voltage stabilizing capacitor and the second electrode of the second transistor is connected to each other as a single piece, and are made of a conductive semiconductor material;
the first gate layer comprises: the gate of the driving transistor, the gate of the first transistor, the gate of the second transistor, the gate of the third transistor, the gate of the fourth transistor, the gate of the fifth transistor, the gate of the sixth transistor, the gate of the seventh transistor, the gate of the eighth transistor, the first reset signal terminal, the second reset signal terminal, the control signal terminal and the first electrode of the storage capacitor;

the second gate layer comprises the initialization signal terminal, the second electrode of the voltage stabilizing capacitor and the second electrode of the storage capacitor;

the first source-drain layer comprises: the first power supply signal terminal, the data signal terminal, a first light emitting access structure and a voltage stabilizing connection structure; wherein the first power supply signal terminal is connected to the second electrode of the storage capacitor through a via hole extending through the second interlayer insulation layer, and is connected to the first electrode of the sixth transistor through a via hole extending through the gate insulating layer, the first interlayer insulating layer and the second interlayer insulating layer; the data signal terminal is connected to the second electrode of the fifth transistor through a via hole extending through the gate insulating layer, the first interlayer insulating layer and the second interlayer insulating layer; the first light emitting access structure is connected to the second electrode of the seventh transistor through a via hole extending through the gate insulating layer, the first interlayer insulating layer and the second interlayer insulating layer; and the voltage stabilizing connection structure is connected to the second electrode of the storage capacitor through a via hole extending through the second interlayer insulating layer, and is connected to the second electrode of the voltage stabilizing capacitor through a via hole extending through the second interlayer insulating layer;

the second source-drain layer further comprises a second light emitting access structure; wherein the auxiliary conductive structure overlaps with the first power supply signal terminal and is connected to the first power supply signal terminal through a via hole extending through the first planarization layer; and the second light emitting access structure is connected to the first light emitting access structure through a via hole extending through the first planarization layer;

a second planarization layer; and the first electrode of the light emitting device, wherein the first electrode of the light emitting device is connected to the second light emitting access structure through a via hole extending through the second planarization layer.

19. A display apparatus, comprising the display substrate of claim 1.

* * * * *